US012581700B2

(12) United States Patent
Nakano et al.

(10) Patent No.: US 12,581,700 B2
(45) Date of Patent: Mar. 17, 2026

(54) SEMICONDUCTOR DEVICE

(71) Applicant: ROHM CO., LTD., Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/472,704

(22) Filed: Sep. 22, 2023

(65) Prior Publication Data

US 2024/0014258 A1 Jan. 11, 2024

Related U.S. Application Data

(63) Continuation of application No. 17/464,296, filed on Sep. 1, 2021, now Pat. No. 11,804,520, which is a
(Continued)

(30) Foreign Application Priority Data

Feb. 2, 2011 (JP) ................................. 2011-020730
Apr. 28, 2011 (JP) ................................. 2011-101786

(51) Int. Cl.
 *H01L 29/06* (2006.01)
 *H10D 12/01* (2025.01)
 (Continued)

(52) U.S. Cl.
 CPC ......... *H10D 62/109* (2025.01); *H10D 12/031* (2025.01); *H10D 30/025* (2025.01);
 (Continued)

(58) Field of Classification Search
 CPC .. H10D 62/109; H10D 12/031; H10D 30/025; H10D 30/63; H10D 30/668;
 (Continued)

(56) References Cited

U.S. PATENT DOCUMENTS 5,177,572 A 1/1993 Murakami
5,821,583 A 10/1998 Hshieh et al.
 (Continued)

FOREIGN PATENT DOCUMENTS

EP 0893830 A1 1/1999
EP 2276066 A1 1/2011
 (Continued)

OTHER PUBLICATIONS

Office Action issued Nov. 2, 2023 in European Patent Application No. 18204665.6, 7 pages. (EP Patent No. 1271475 cited in the OA seems to be a typographical error of EP Application No. 12741475, which is the parent application of EP Application No. 18204665.6 and is EP Publication No. 2672517A1.).
 (Continued)

*Primary Examiner* — Cuong B Nguyen
(74) *Attorney, Agent, or Firm* — XSENSUS LLP

(57) ABSTRACT

A semiconductor device includes a semiconductor layer made of a wide bandgap semiconductor and including a gate trench; a gate insulating film formed on the gate trench; and a gate electrode embedded in the gate trench to be opposed to the semiconductor layer through the gate insulating film. The semiconductor layer includes a first conductivity type source region; a second conductivity type body region; a first conductivity type drift region; a second conductivity type first breakdown voltage holding region; a source trench passing through the first conductivity type source region and the second conductivity type body region from the front surface and reaching a drain region; and a second conductivity type second breakdown voltage region selectively formed on an edge portion of the source trench where the sidewall and the bottom wall thereof intersect with each other in a parallel region of the source trench.

11 Claims, 34 Drawing Sheets

Related U.S. Application Data continuation of application No. 16/865,267, filed on May 1, 2020, now Pat. No. 11,133,377, which is a continuation of application No. 16/050,794, filed on Jul. 31, 2018, now Pat. No. 10,680,060, which is a continuation of application No. 15/441,850, filed on Feb. 24, 2017, now Pat. No. 10,068,964, which is a continuation of application No. 14/821,056, filed on Aug. 7, 2015, now Pat. No. 9,620,593, which is a continuation of application No. 13/983,051, filed as application No. PCT/JP2012/052293 on Feb. 1, 2012, now Pat. No. 9,136,322.

(51) Int. Cl.

| | |
|---|---|
| *H10D 30/01* | (2025.01) |
| *H10D 30/63* | (2025.01) |
| *H10D 30/66* | (2025.01) |
| *H10D 62/10* | (2025.01) |
| *H10D 62/17* | (2025.01) |
| *H10D 62/40* | (2025.01) |
| *H10D 62/832* | (2025.01) |
| *H10D 64/27* | (2025.01) |
| *H10D 84/83* | (2025.01) |
| *H01L 21/04* | (2006.01) |
| *H10D 62/13* | (2025.01) |
| *H10D 64/23* | (2025.01) |

(52) U.S. Cl.
CPC ........... *H10D 30/63* (2025.01); *H10D 30/668* (2025.01); *H10D 62/102* (2025.01); *H10D 62/107* (2025.01); *H10D 62/127* (2025.01); *H10D 62/292* (2025.01); *H10D 62/393* (2025.01); *H10D 62/405* (2025.01); *H10D 62/8325* (2025.01); *H10D 64/513* (2025.01); *H10D 84/83* (2025.01); *H01L 21/046* (2013.01); *H10D 30/665* (2025.01); *H10D 62/157* (2025.01); *H10D 64/256* (2025.01)

(58) Field of Classification Search
CPC .. H10D 62/102; H10D 62/107; H10D 62/127; H10D 62/292; H10D 62/393; H10D 62/405; H10D 62/8325; H10D 64/513; H10D 84/83; H10D 30/665; H10D 62/157; H10D 64/256; H01L 21/046
See application file for complete search history.

(56) References Cited

U.S. PATENT DOCUMENTS

| | | | |
|---|---|---|---|
| 5,976,936 | A | 11/1999 | Miyajima et al. |
| 6,342,709 | B1 | 1/2002 | Sugawara et al. |
| 9,136,322 | B2 | 9/2015 | Nakano et al. |
| 9,620,593 | B2 | 4/2017 | Nakano et al. |
| 10,068,964 | B2 | 9/2018 | Nakano et al. |
| 2004/0195618 | A1 | 10/2004 | Saito et al. |
| 2005/0116282 | A1 | 6/2005 | Pattanayak et al. |
| 2005/0218472 | A1 | 10/2005 | Okada et al. |
| 2006/0220151 | A1 | 10/2006 | Loechelt et al. |

| | | | |
|---|---|---|---|
| 2007/0020850 | A1 | 1/2007 | Takaishi |
| 2008/0079065 | A1 | 4/2008 | Zhang et al. |
| 2008/0085591 | A1 | 4/2008 | Gomez et al. |
| 2008/0230787 | A1 | 9/2008 | Suzuki et al. |
| 2009/0026535 | A1 | 1/2009 | Matsuura et al. |
| 2009/0032821 | A1 | 2/2009 | Onose et al. |
| 2009/0272982 | A1 | 11/2009 | Nakamura et al. |
| 2010/0044786 | A1 | 2/2010 | Inomata et al. |
| 2010/0078714 | A1 | 4/2010 | Tu et al. |
| 2010/0193796 | A1 | 8/2010 | Nakano |
| 2010/0193799 | A1 | 8/2010 | Nakano et al. |
| 2011/0024831 | A1 | 2/2011 | Nakano |
| 2011/0121316 | A1 | 5/2011 | Harada |
| 2011/0254010 | A1* | 10/2011 | Zhang .................. H10D 62/822 |
| | | | 438/137 |
| 2011/0254088 | A1* | 10/2011 | Darwish ............ H10D 30/0297 |
| | | | 257/341 |
| 2012/0049202 | A1 | 3/2012 | Nakano |
| 2012/0132926 | A1 | 5/2012 | Nakano et al. |
| 2013/0001680 | A1 | 1/2013 | Nakano |
| 2013/0306983 | A1 | 11/2013 | Nakano et al. |
| 2013/0341712 | A1* | 12/2013 | Burke .................. H10D 64/035 |
| | | | 438/589 |
| 2015/0194492 | A1 | 7/2015 | Nakano et al. |
| 2015/0349057 | A1 | 12/2015 | Nakano et al. |
| 2016/0005857 | A1 | 1/2016 | Nakano |

FOREIGN PATENT DOCUMENTS

| | | | |
|---|---|---|---|
| EP | 2672517 | A1 | 12/2013 |
| JP | S64-059868 | A | 3/1989 |
| JP | H06-151867 | A | 5/1994 |
| JP | H07-161983 | A | 6/1995 |
| JP | H10-098188 | A | 4/1998 |
| JP | 2000-509559 | A | 7/2000 |
| JP | 2004-055976 | A | 2/2004 |
| JP | 2004-311716 | A | 11/2004 |
| JP | 2005-285913 | A | 10/2005 |
| JP | 2008-078174 | A | 4/2008 |
| JP | 2008-235546 | A | 10/2008 |
| JP | 2008-294210 | A | 12/2008 |
| JP | 4241158 | B2 | 3/2009 |
| JP | 2009-260253 | A | 11/2009 |
| JP | 2010-171418 | A | 8/2010 |
| JP | 2010-219361 | A | 9/2010 |
| JP | 2011-044513 | A | 3/2011 |
| JP | 2012-178536 | A | 9/2012 |
| WO | 97/47045 | A1 | 12/1997 |
| WO | 2005/081323 | A2 | 9/2005 |
| WO | 2007105384 | A1 | 9/2007 |
| WO | 2010/119789 | A1 | 10/2010 |

OTHER PUBLICATIONS

European Patent Office Communication Pursuant to Article 94(3) EPC mailed Nov. 8, 2024 in related European Application No. EP18204665.6 (8 pages).

European Patent Office: Office Action of European Patent Application 18204665.6 (related application); Lantier, Roberta; May 20, 2022; 5 pages.

Office Action dated Jan. 13, 2026 issued in connection with corresponding European patent application No. 18204665.6 (9 pages).

* cited by examiner

FIG. 2
A--A SECTION
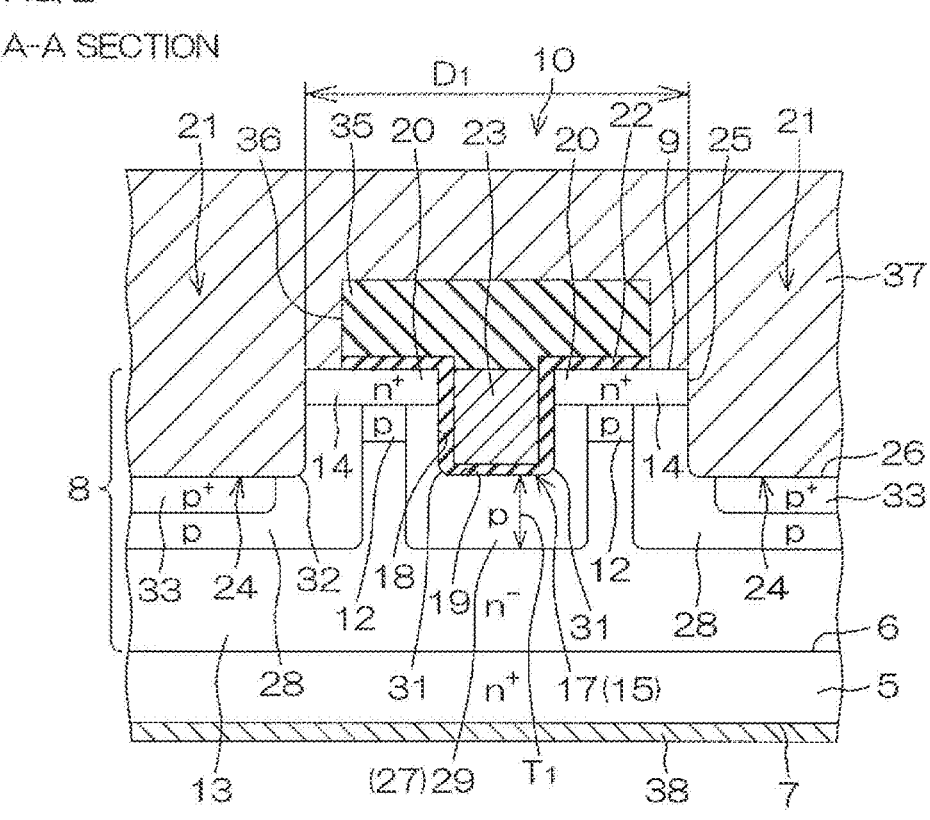
B-B SECTION
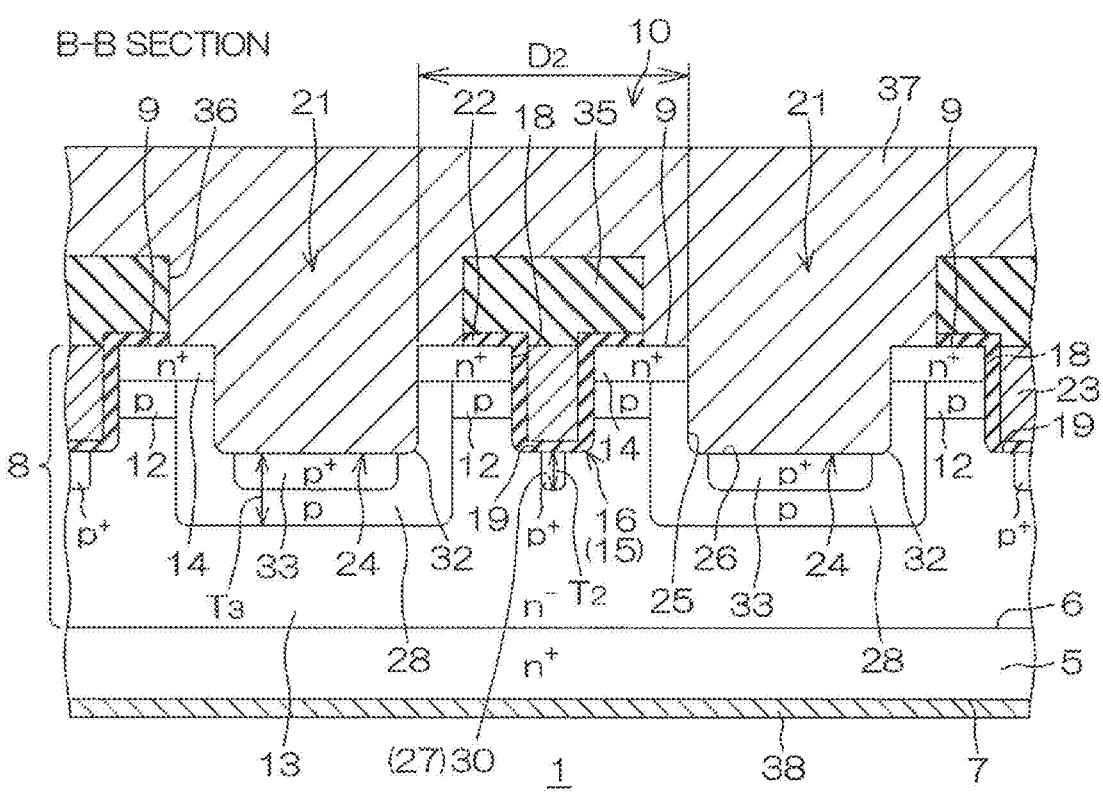

A–A SECTION

B–B SECTION

FIG. 3B
A-A SECTION
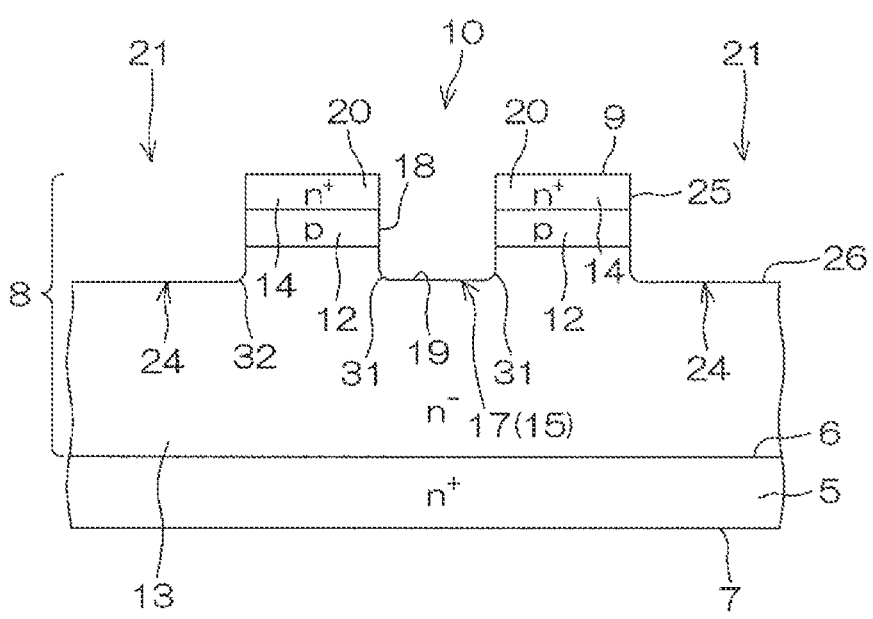
B-B SECTION
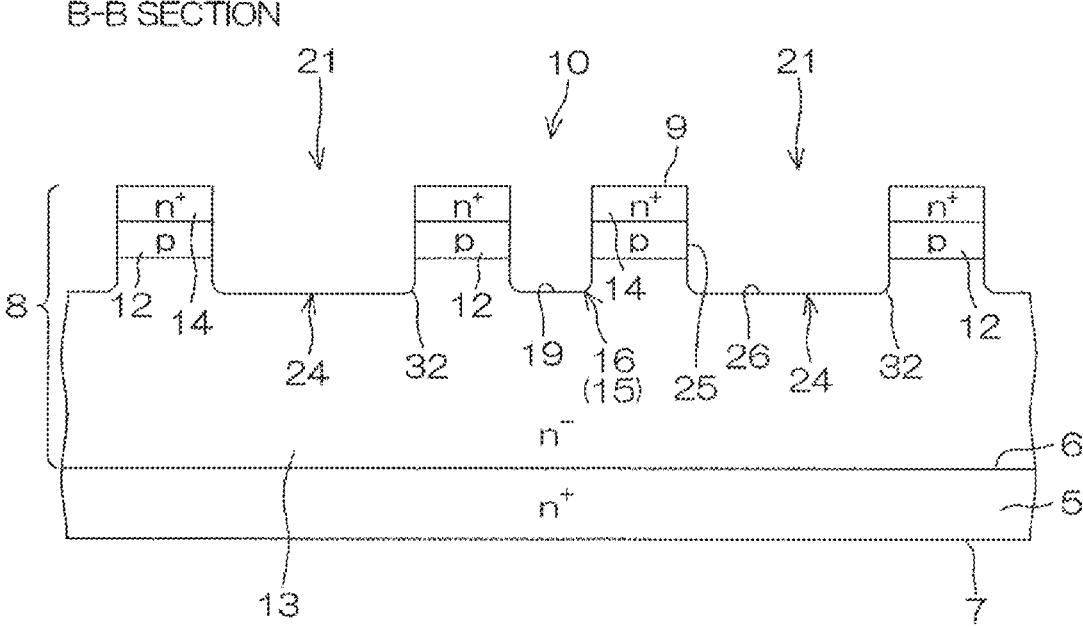

FIG. 3C
A-A SECTION
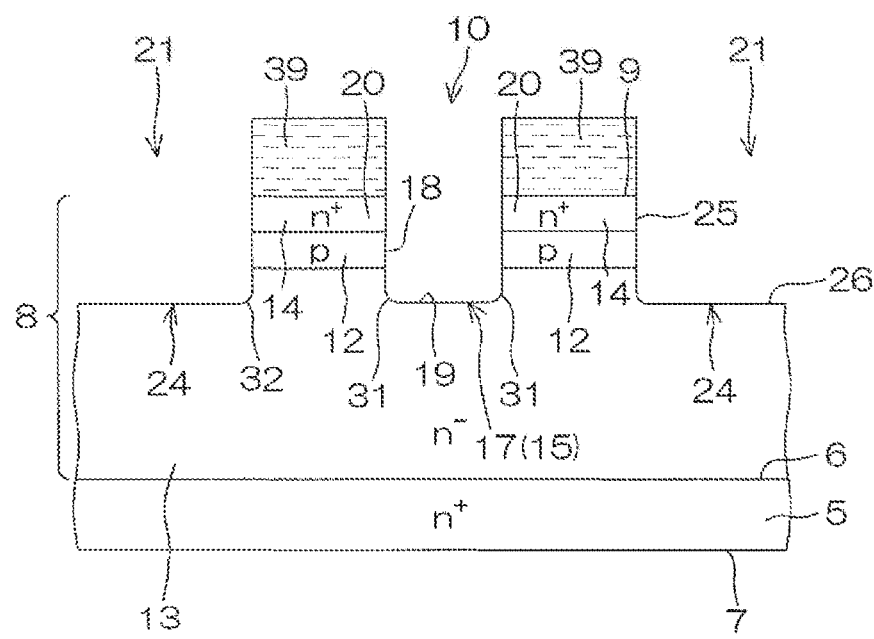
B-B SECTION
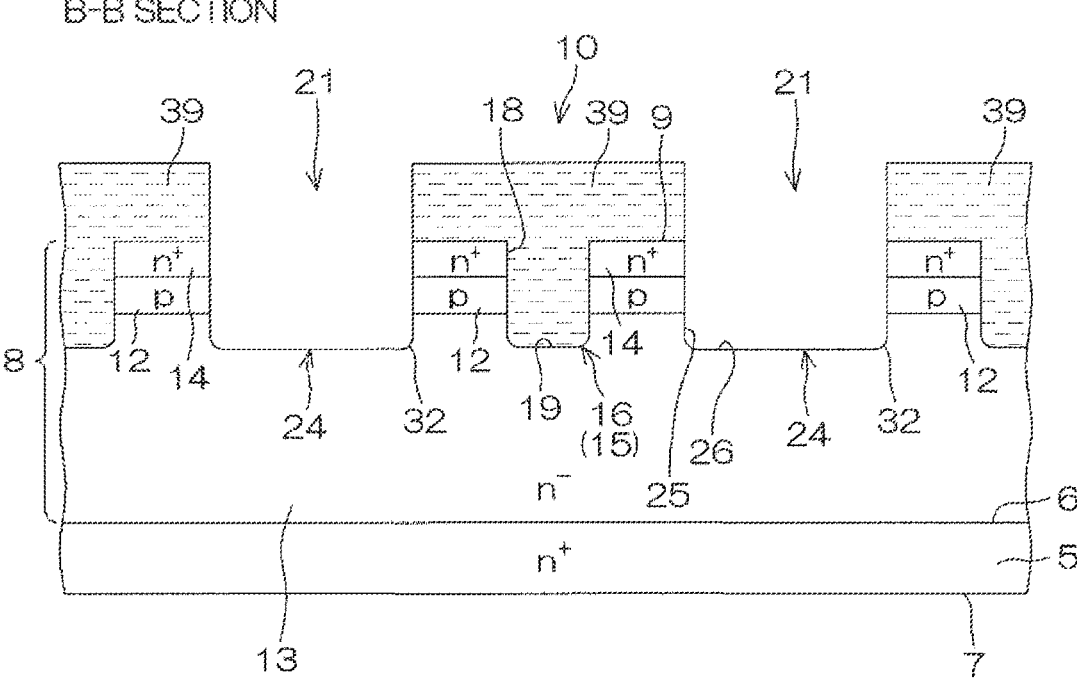

FIG. 3D
A-A SECTION
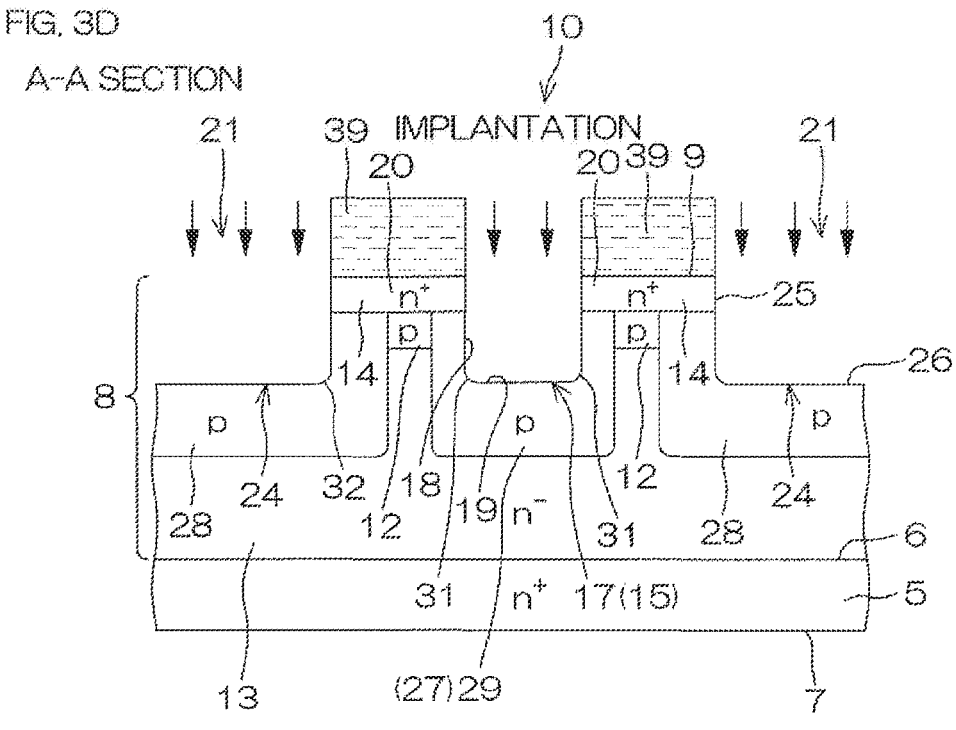
B-B SECTION
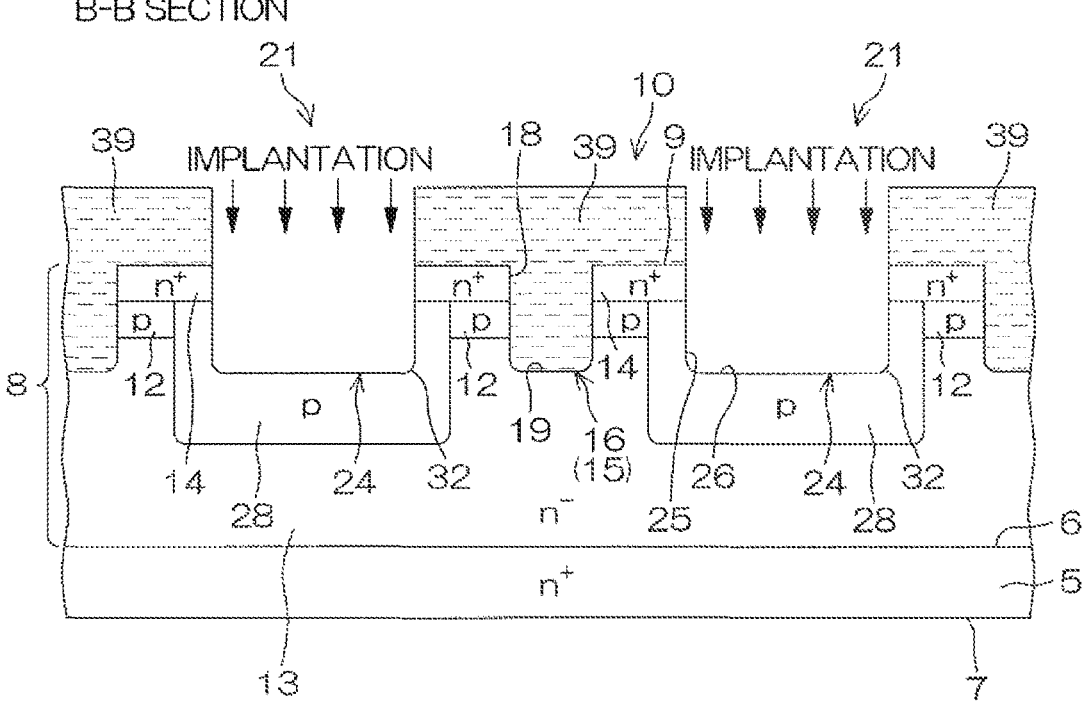

FIG. 3E
A-A SECTION
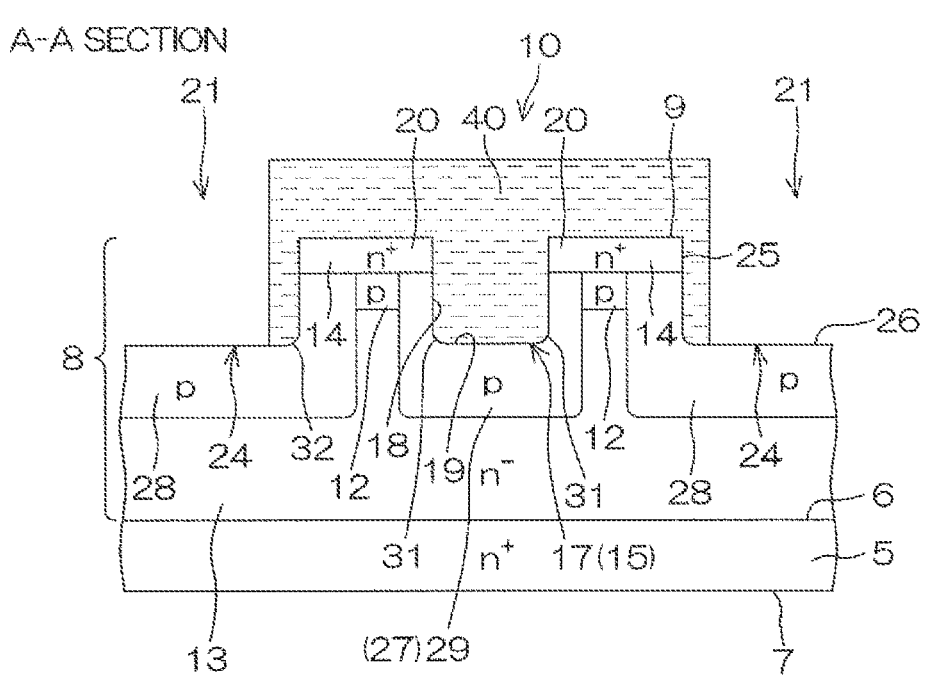
B-B SECTION
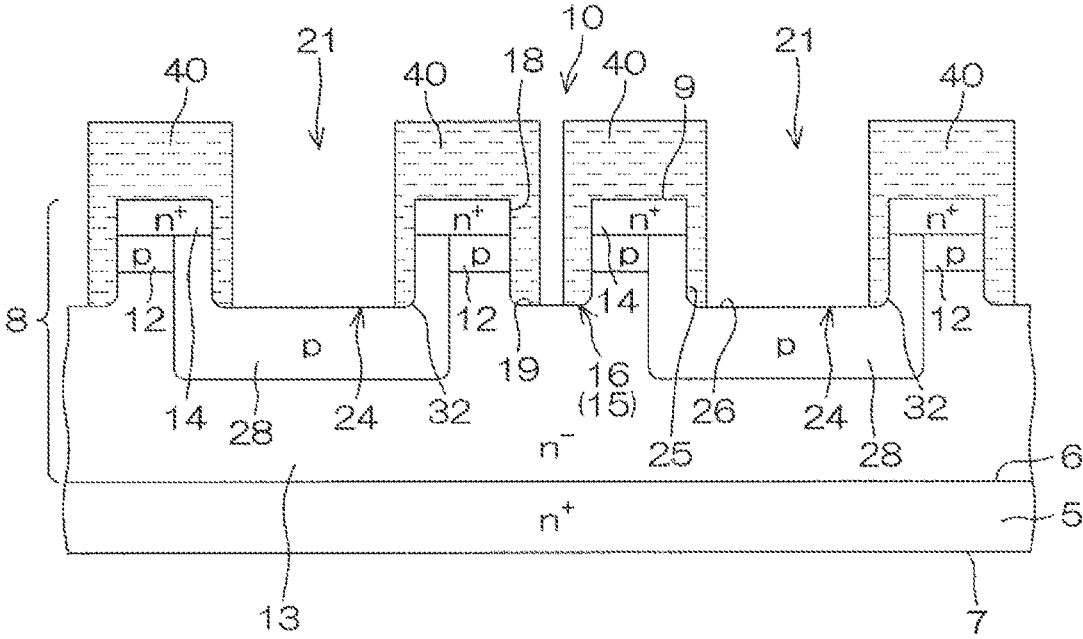

A-A SECTION

B-B SECTION

FIG. 3G
 A-A SECTION
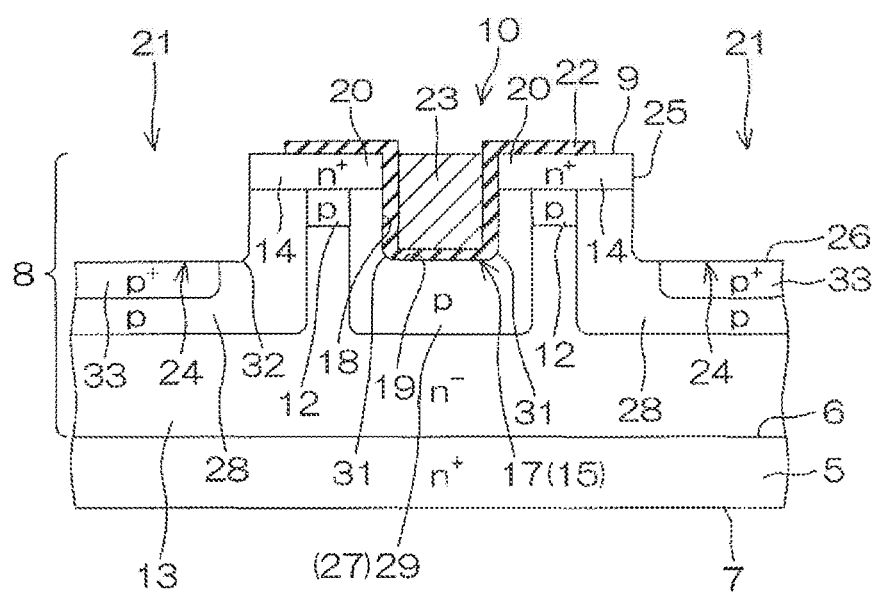
B-B SECTION
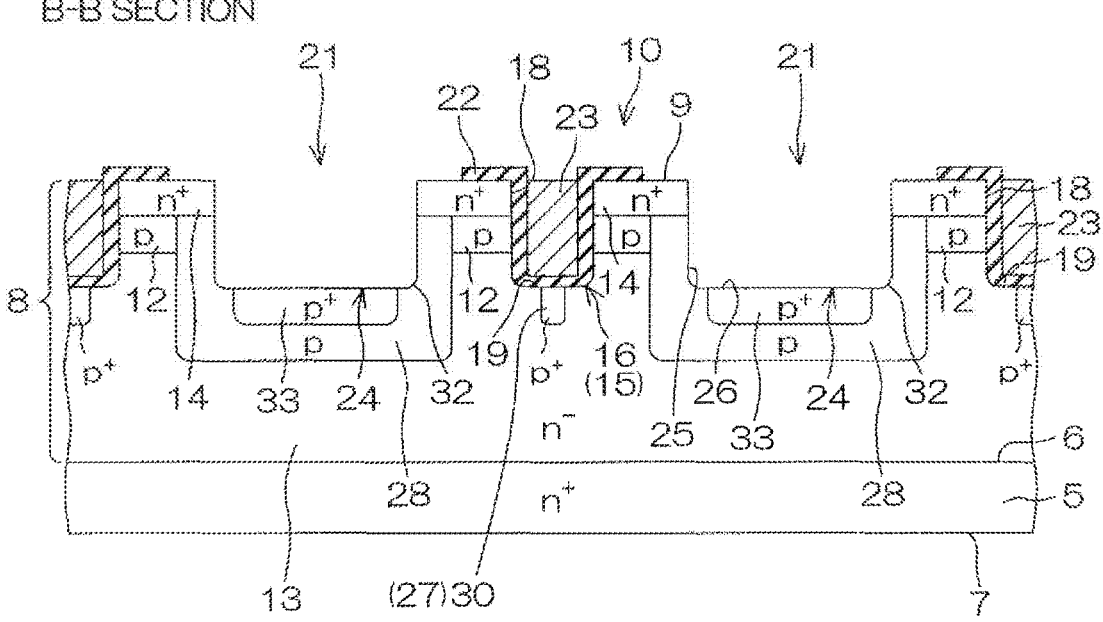

A-A SECTION

B-B SECTION

FIG. 4
A-A SECTION
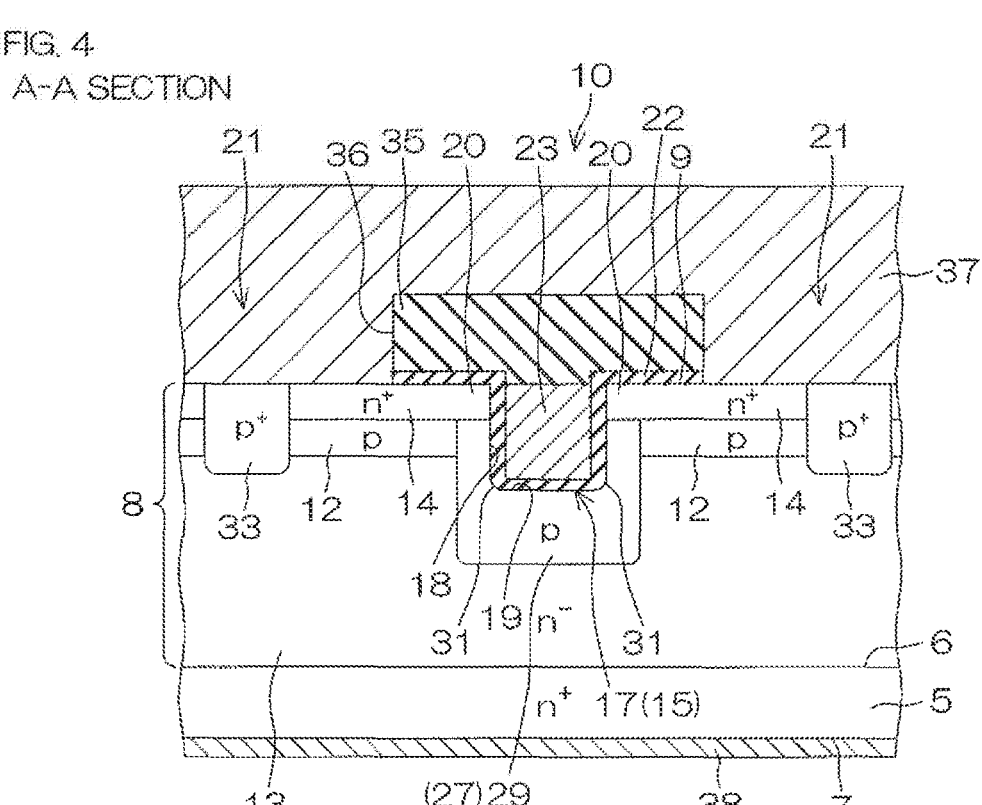
B-B SECTION
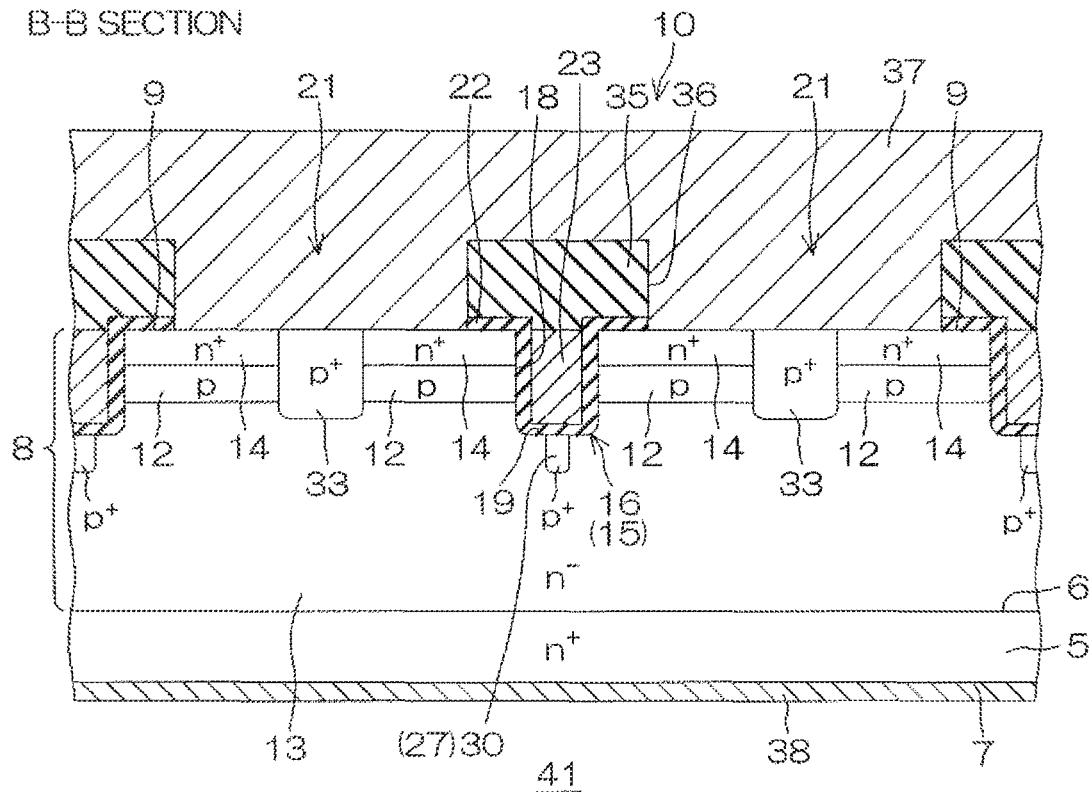
41

C-C SECTION

51

FIG. 7
A-A SECTION
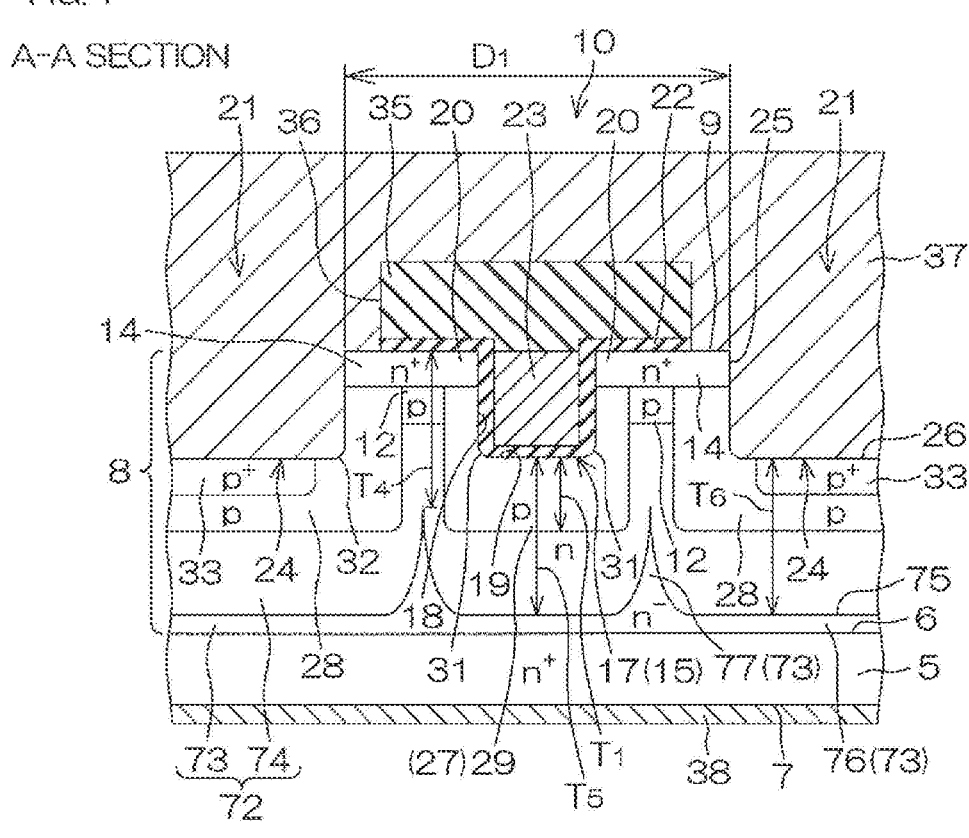
B-B SECTION
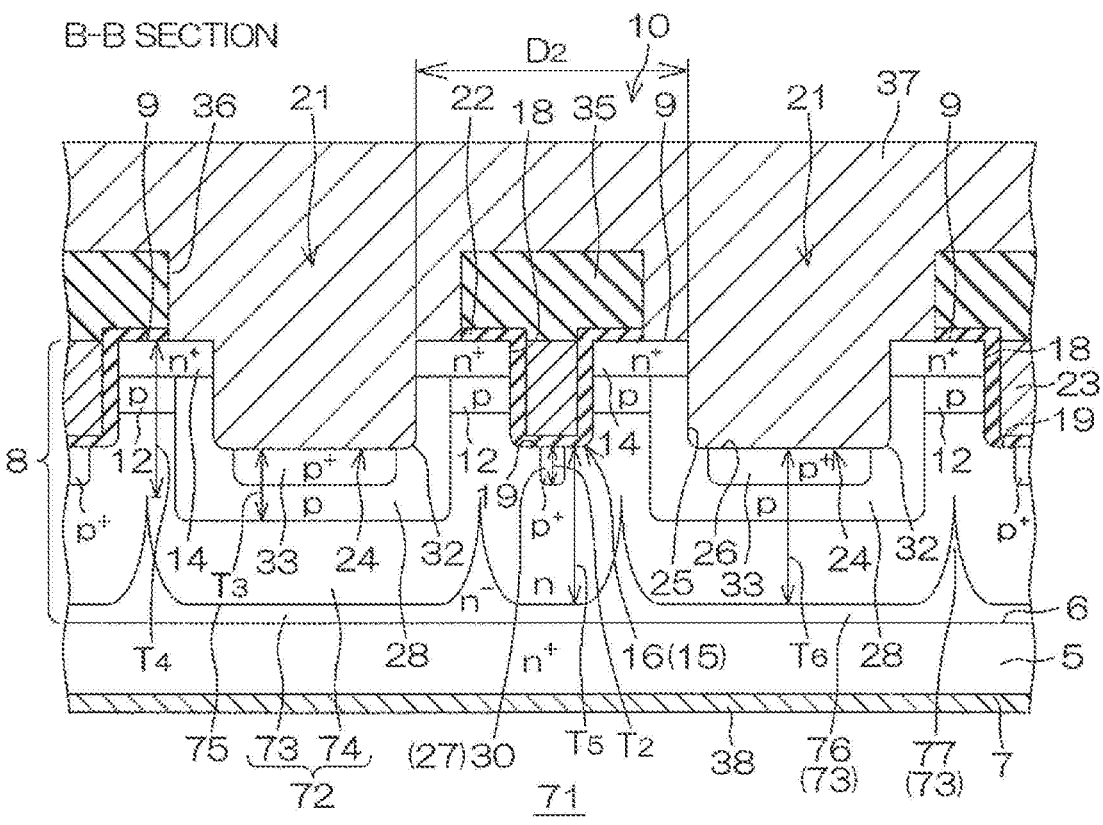

A-A SECTION

B-B SECTION

FIG. 8B
A-A SECTION
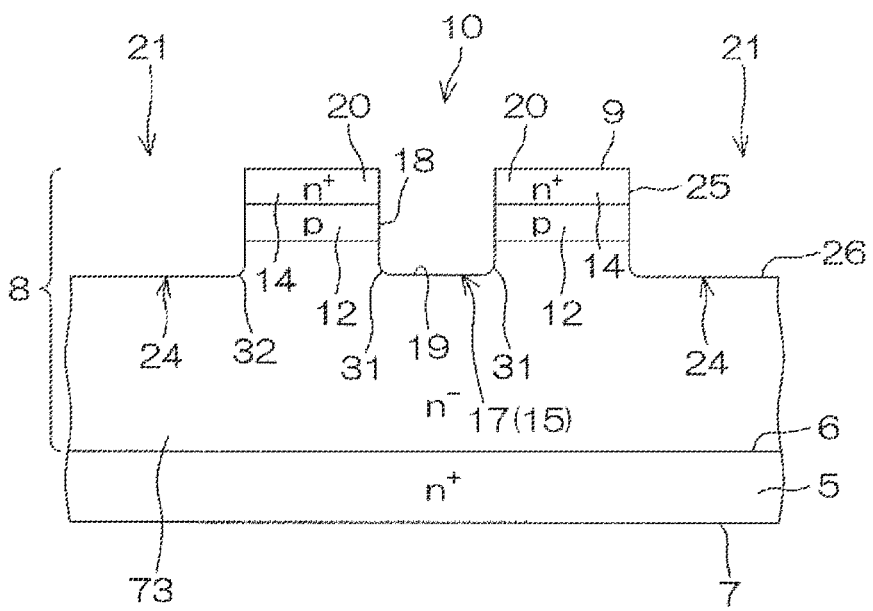
B-B SECTION
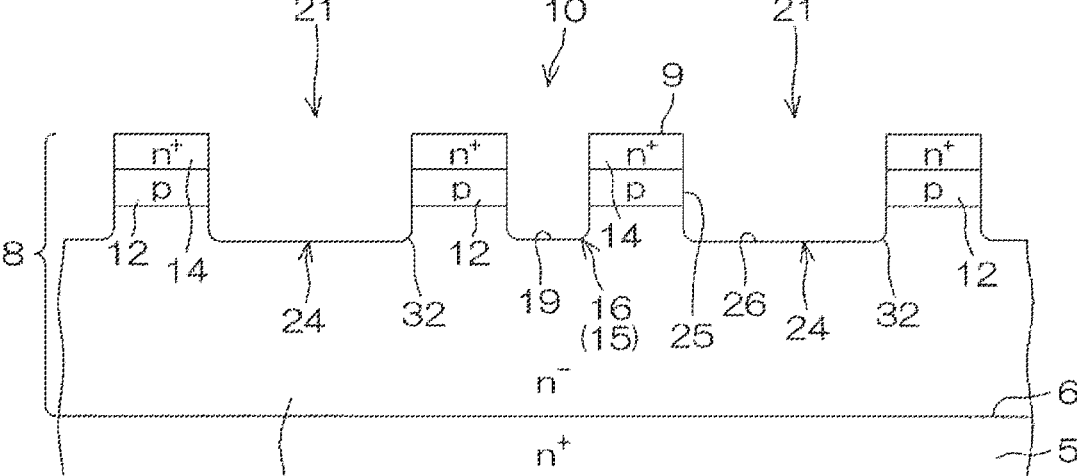

FIG. 8C
A-A SECTION
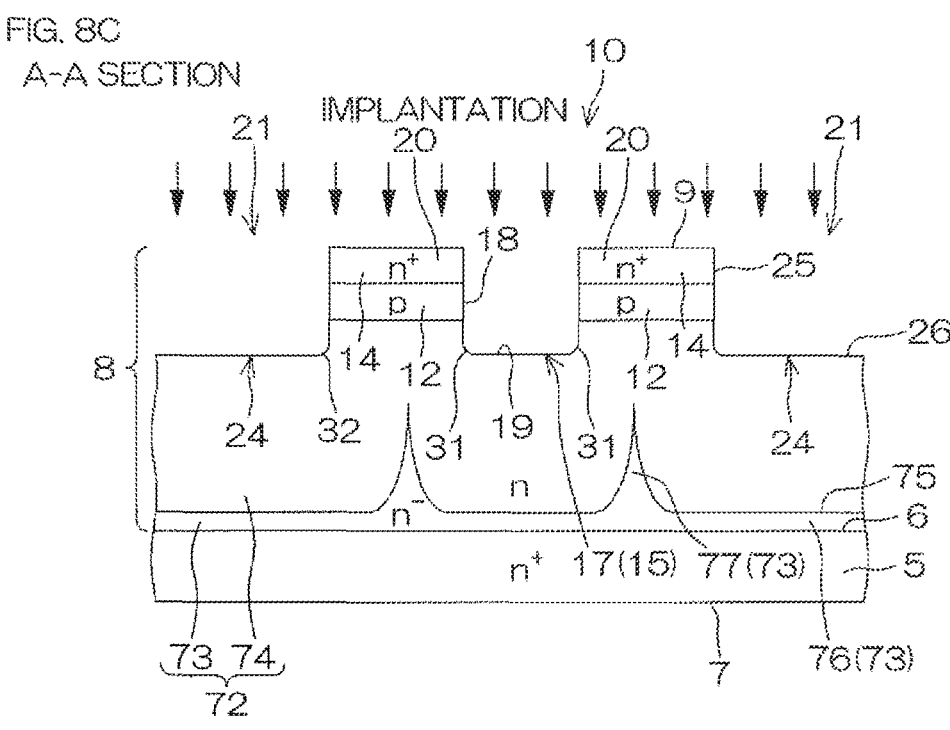
B-B SECTION
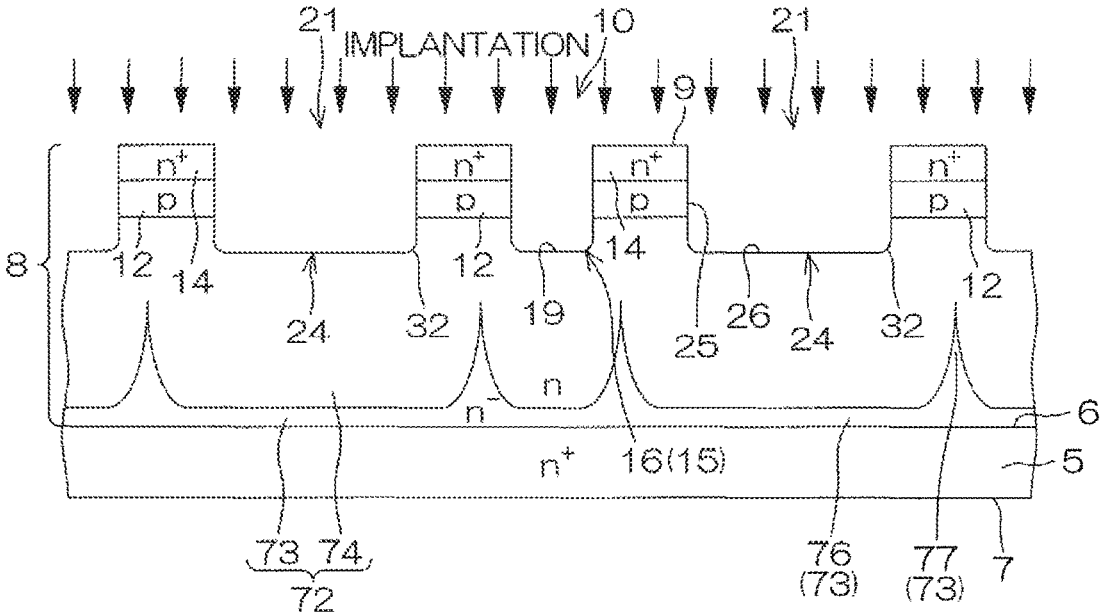

FIG. 8D
A-A SECTION
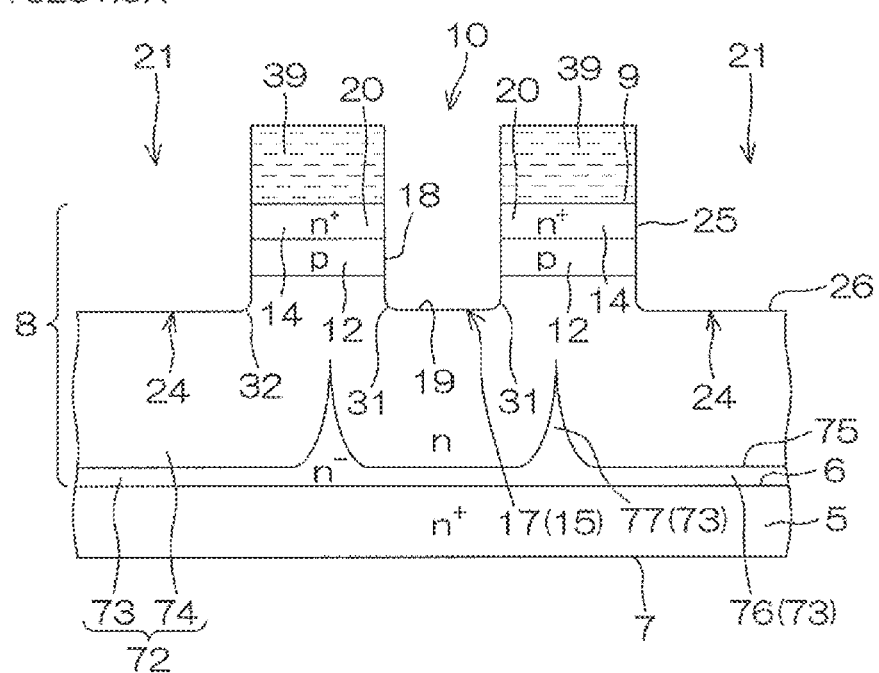
B-B SECTION
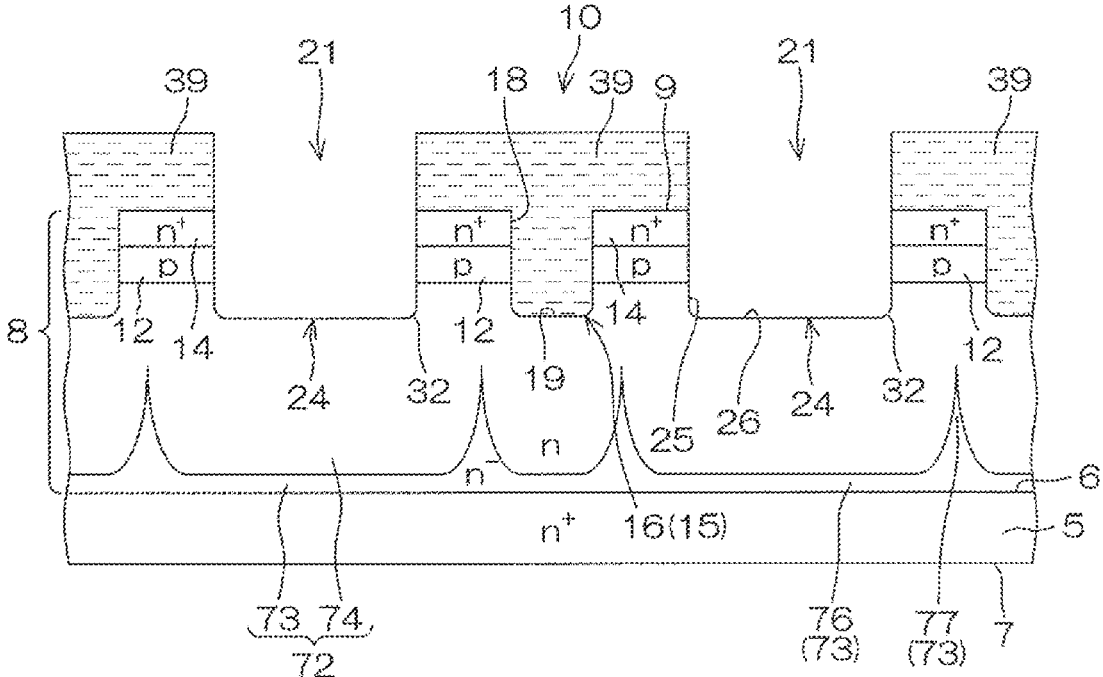

FIG. 8E
A-A SECTION
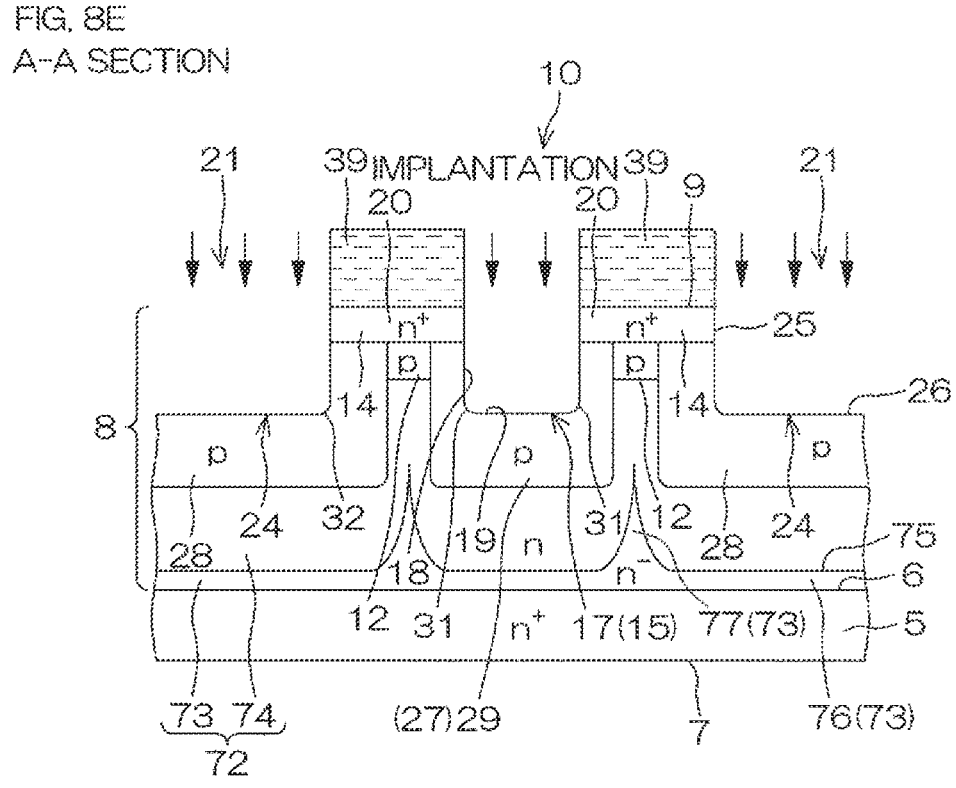
B-B SECTION
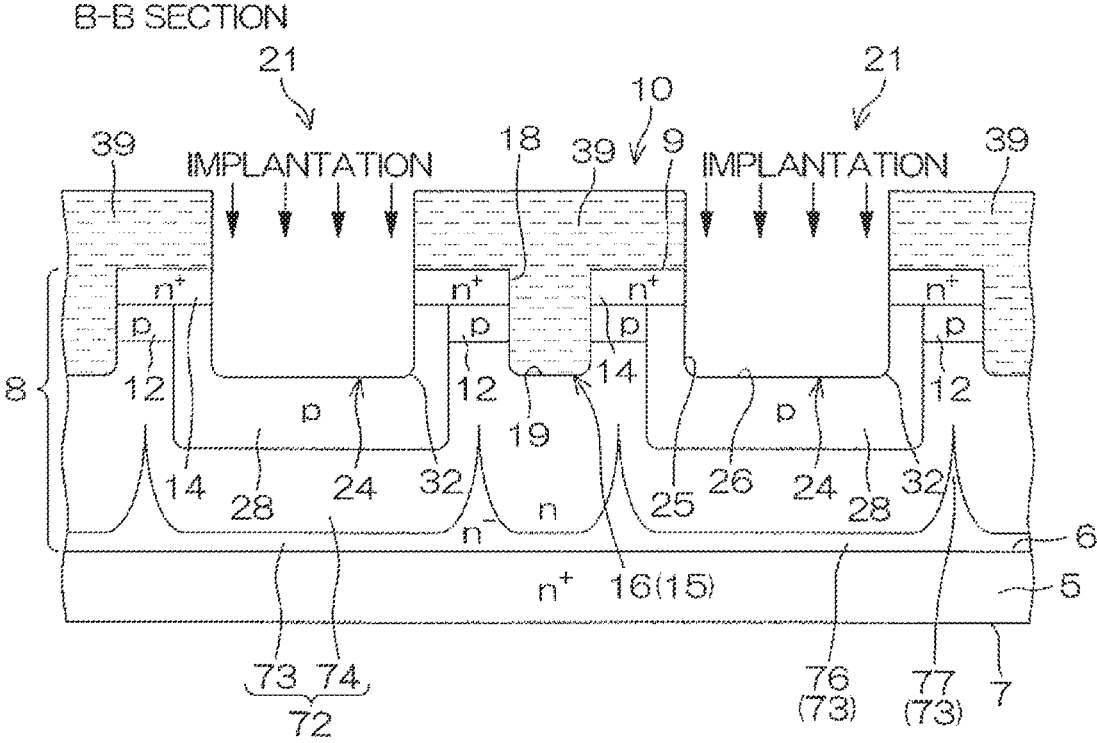

FIG. 8F
A-A SECTION
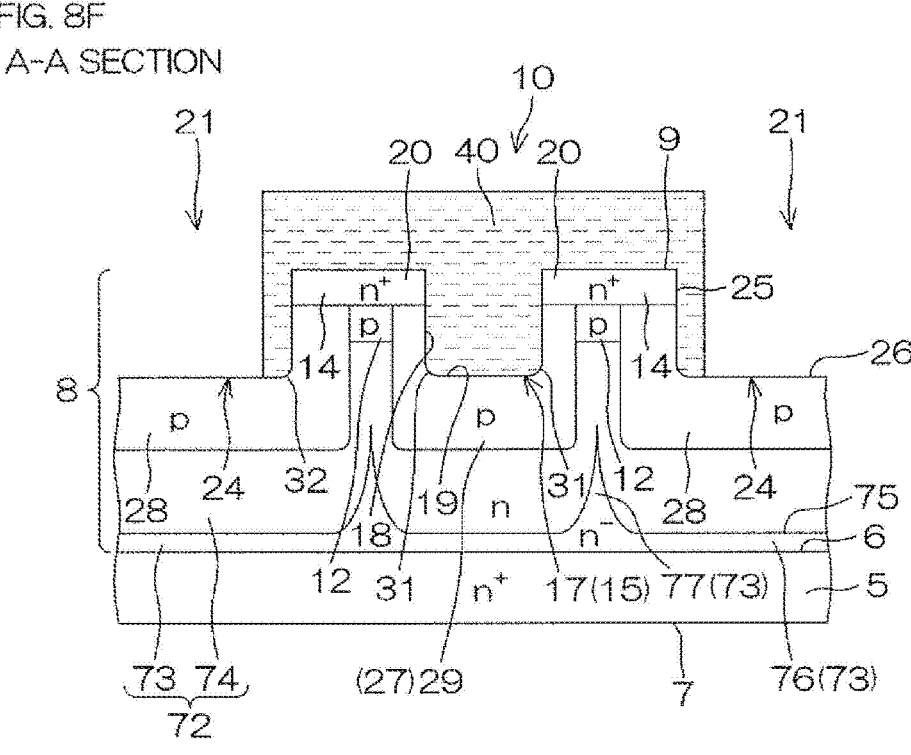
B-B SECTION
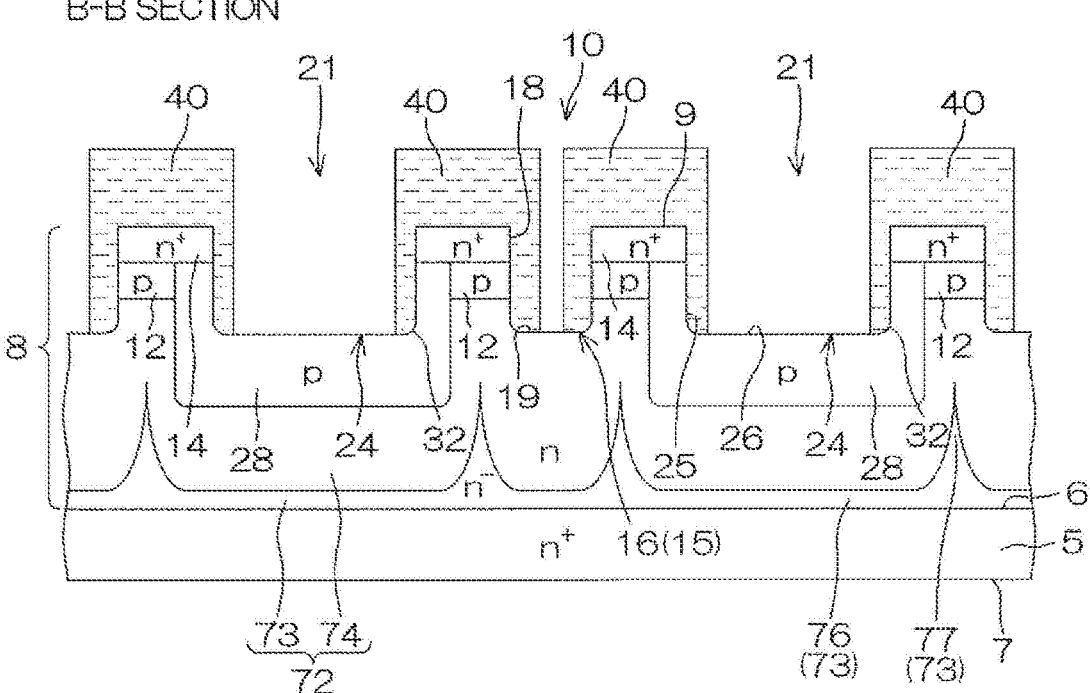

FIG. 8G
 A-A SECTION
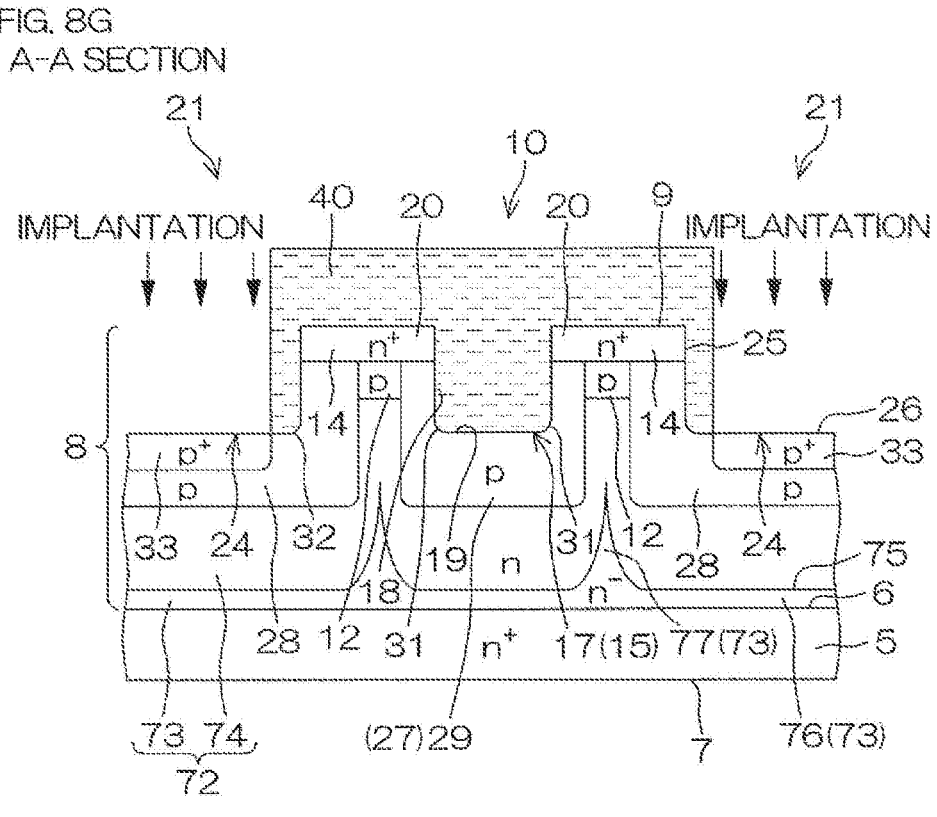
B-B SECTION
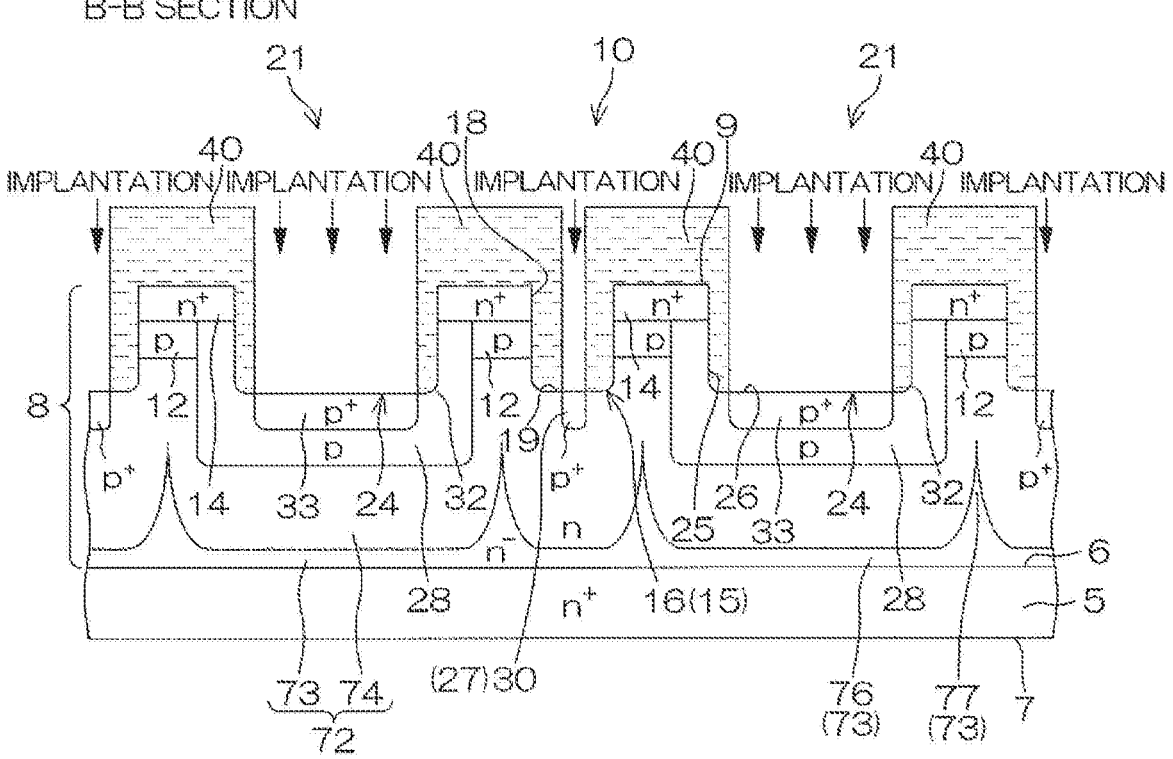

FIG. 8H
A–A SECTION
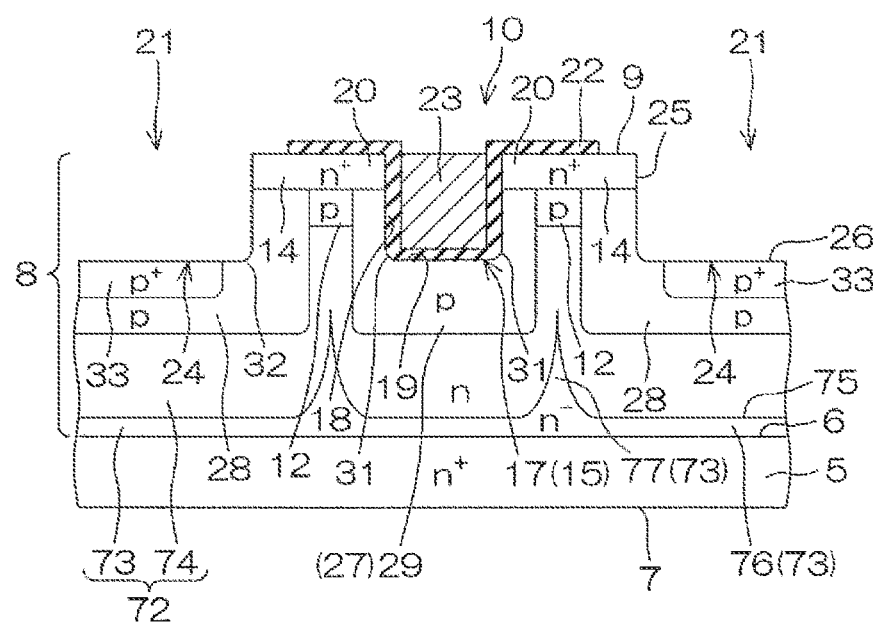
B–B SECTION
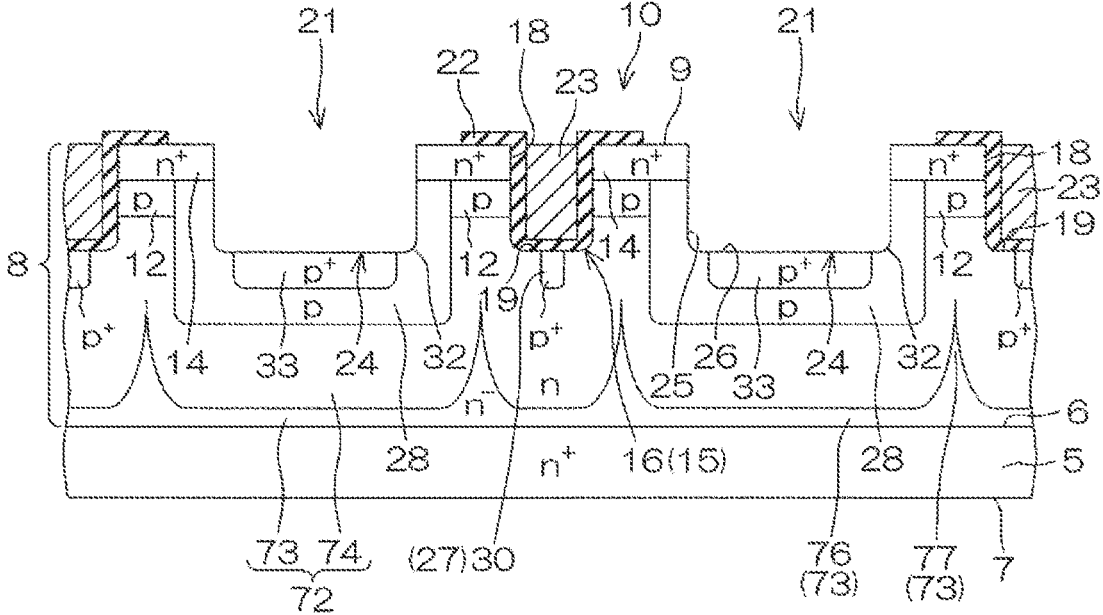

A-A SECTION

B-B SECTION

FIG. 9
A-A SECTION
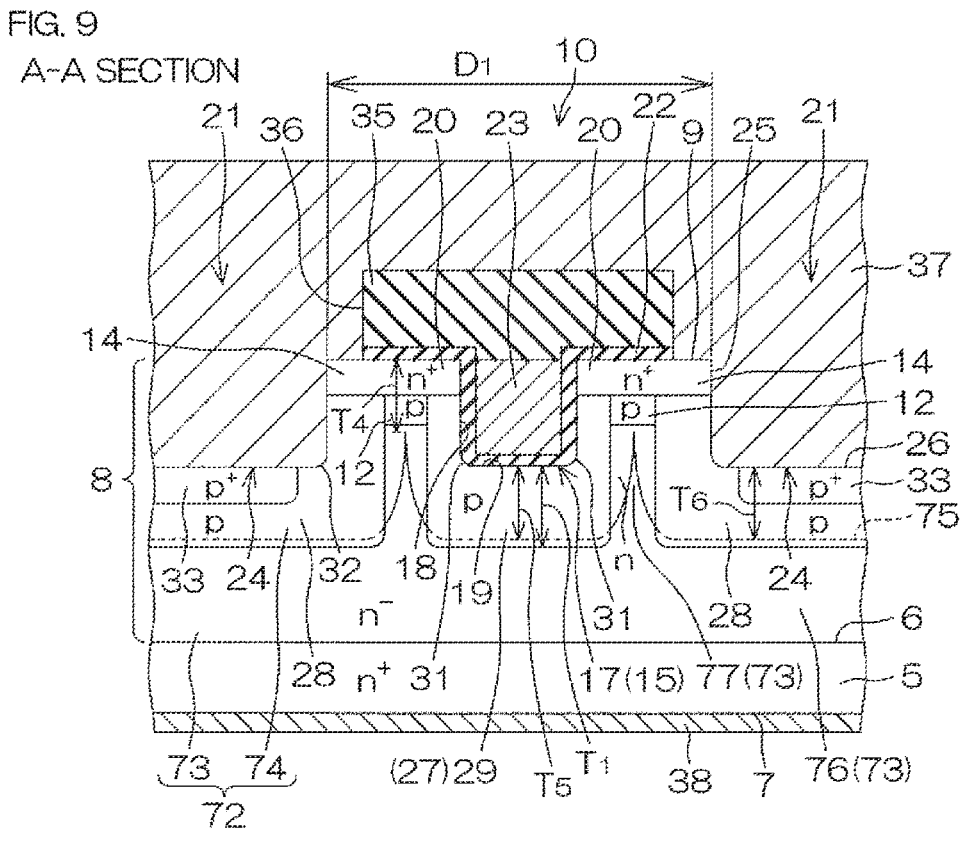
B-B SECTION
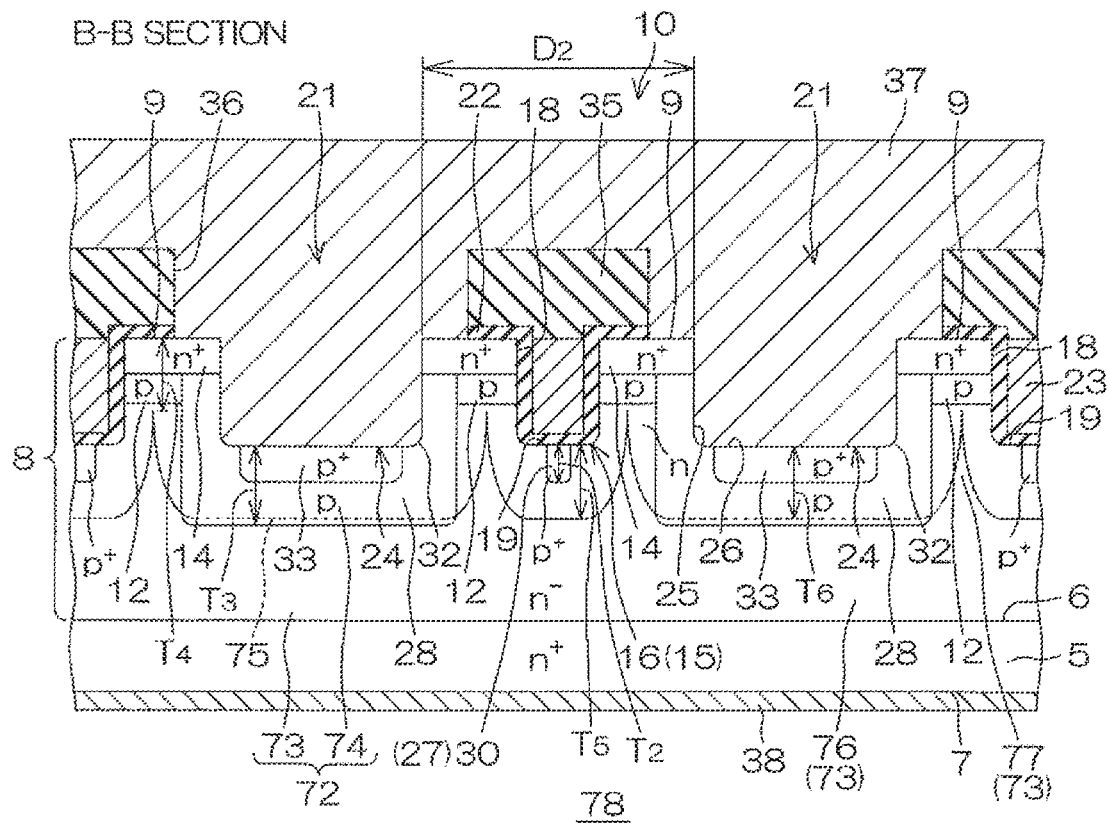

FIG. 10
A-A SECTION
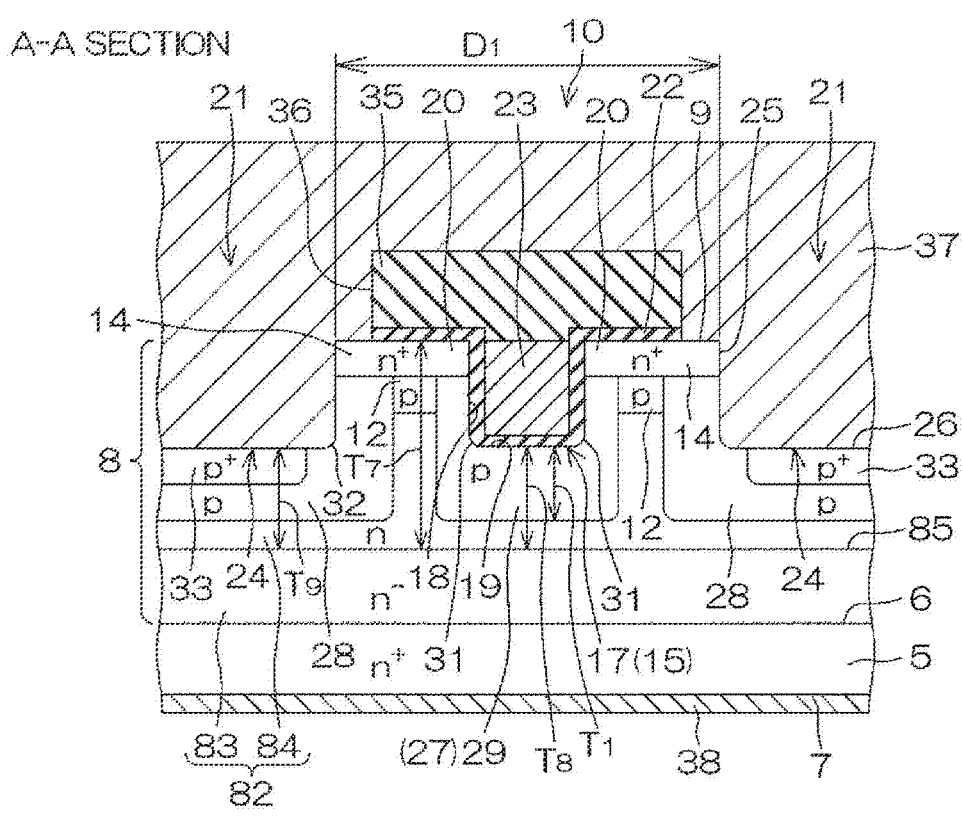
B-B SECTION
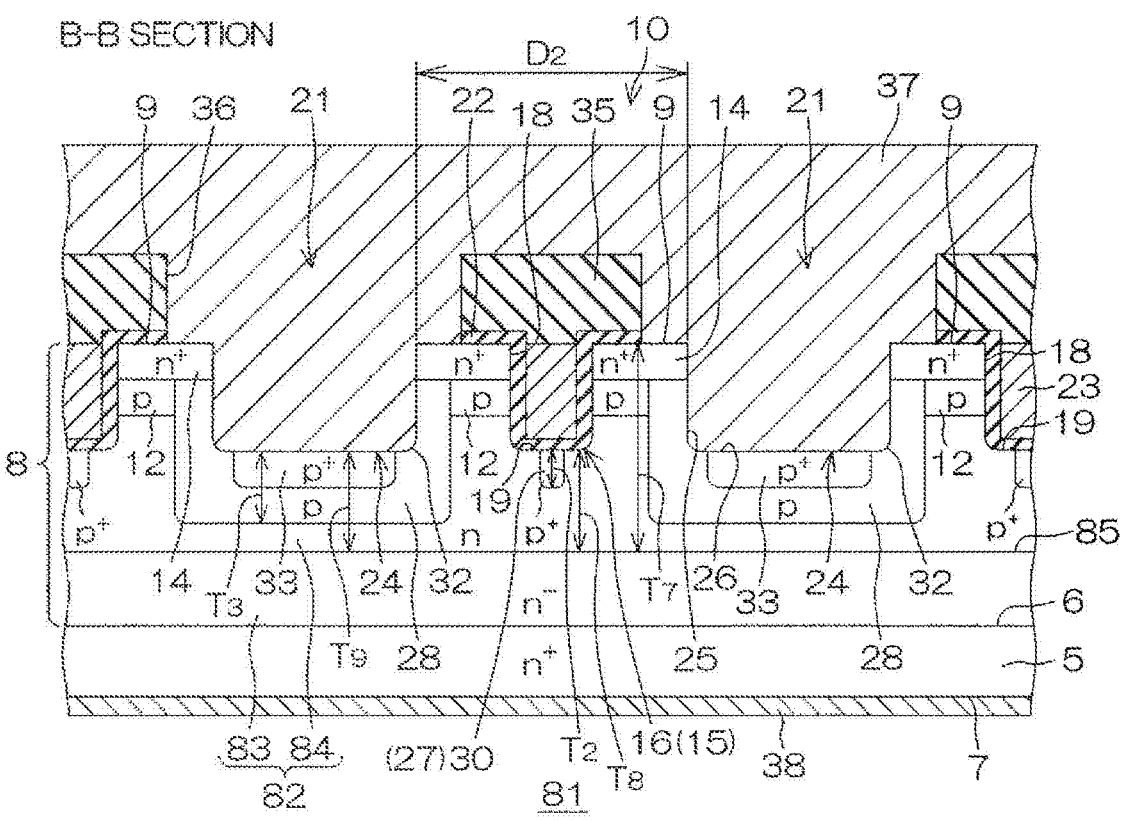

FIG. 11A
A-A SECTION
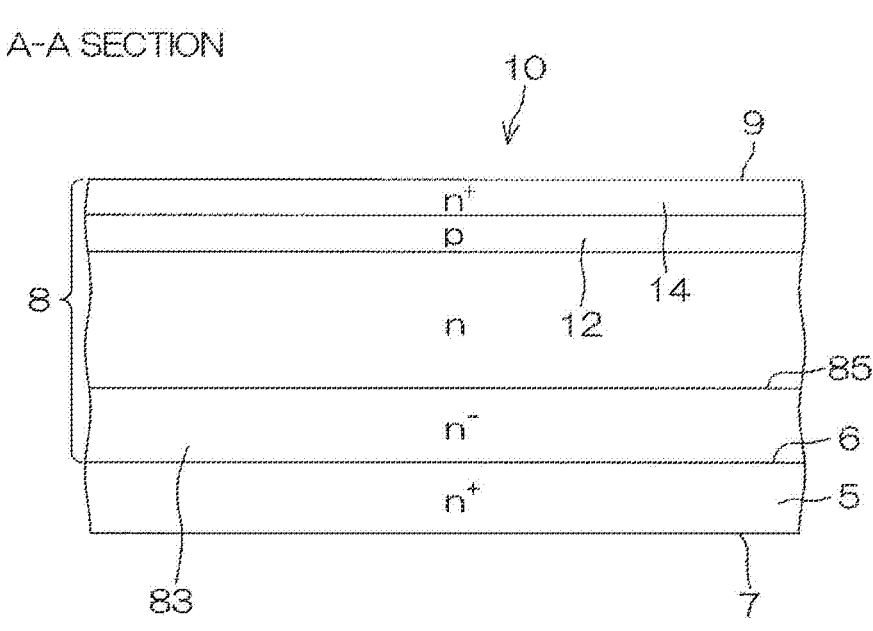
B-B SECTION
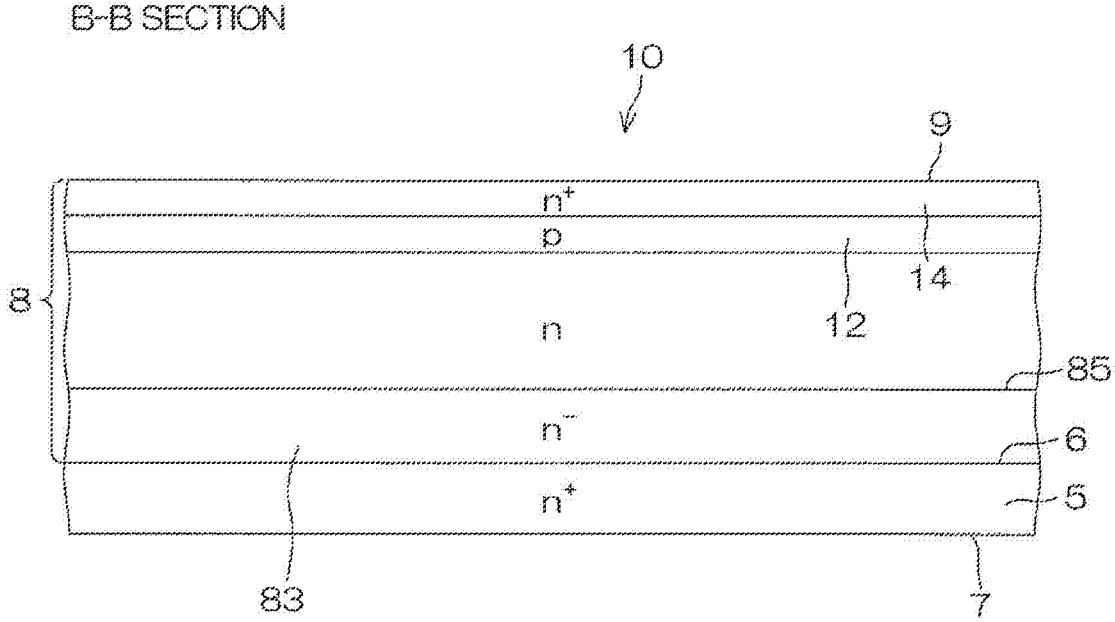

A-A SECTION

FIG. 11C
A-A SECTION
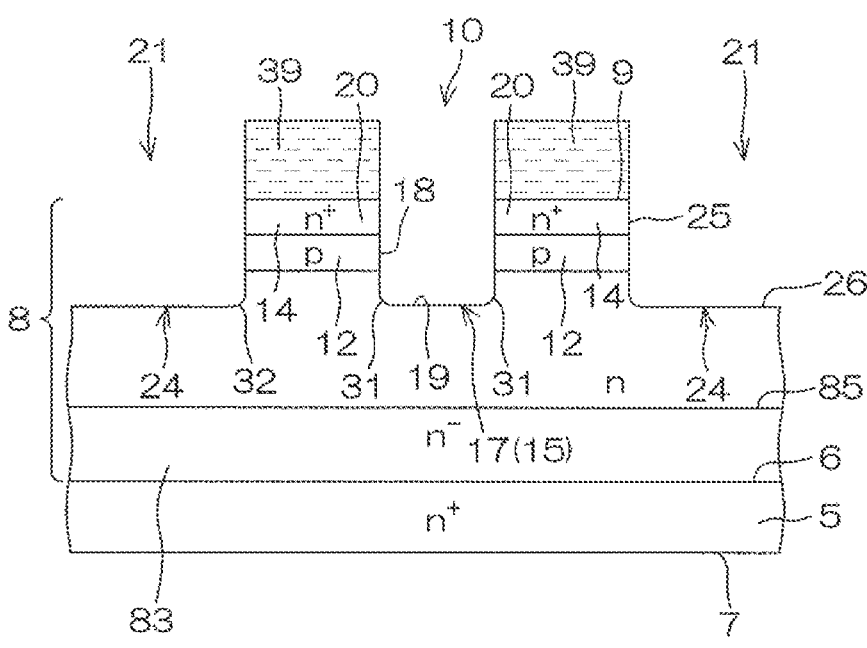
B-B SECTION
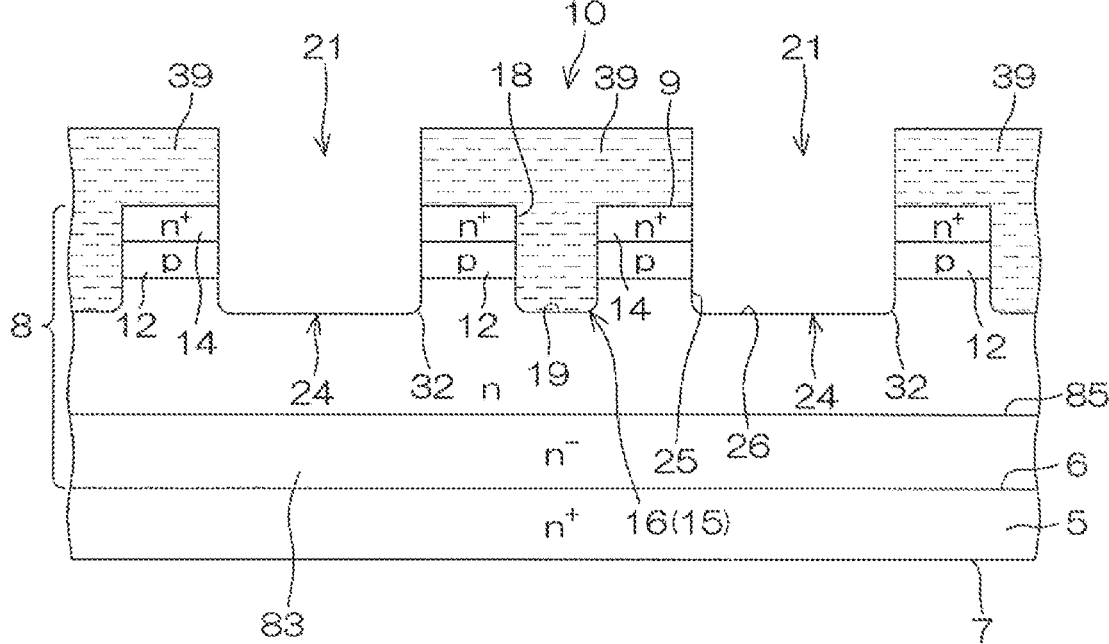

A-A SECTION

FIG. 11E
A-A SECTION
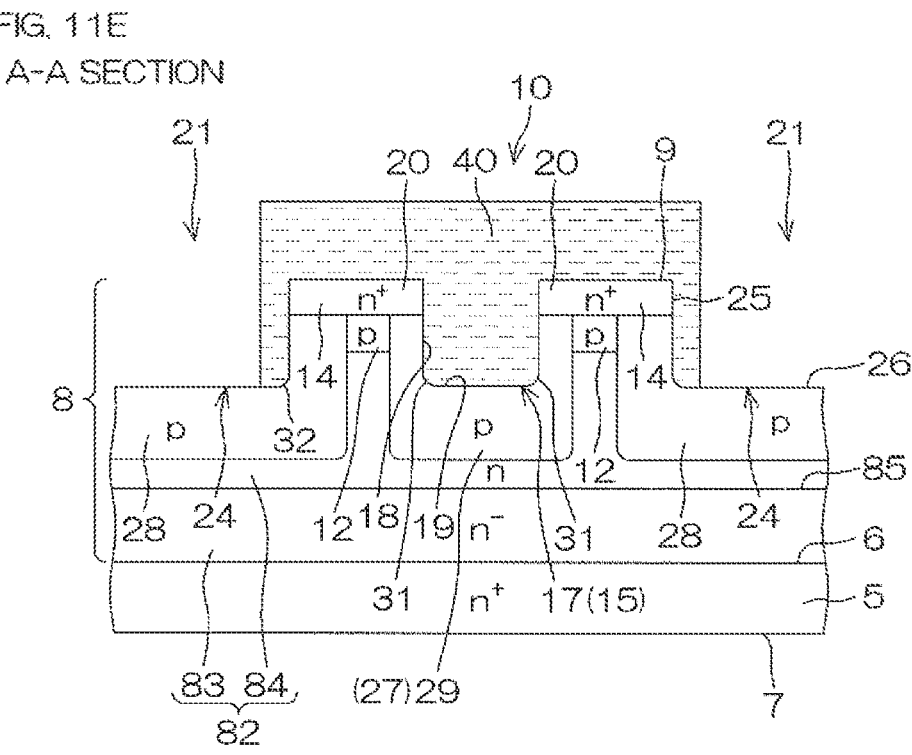
B-B SECTION
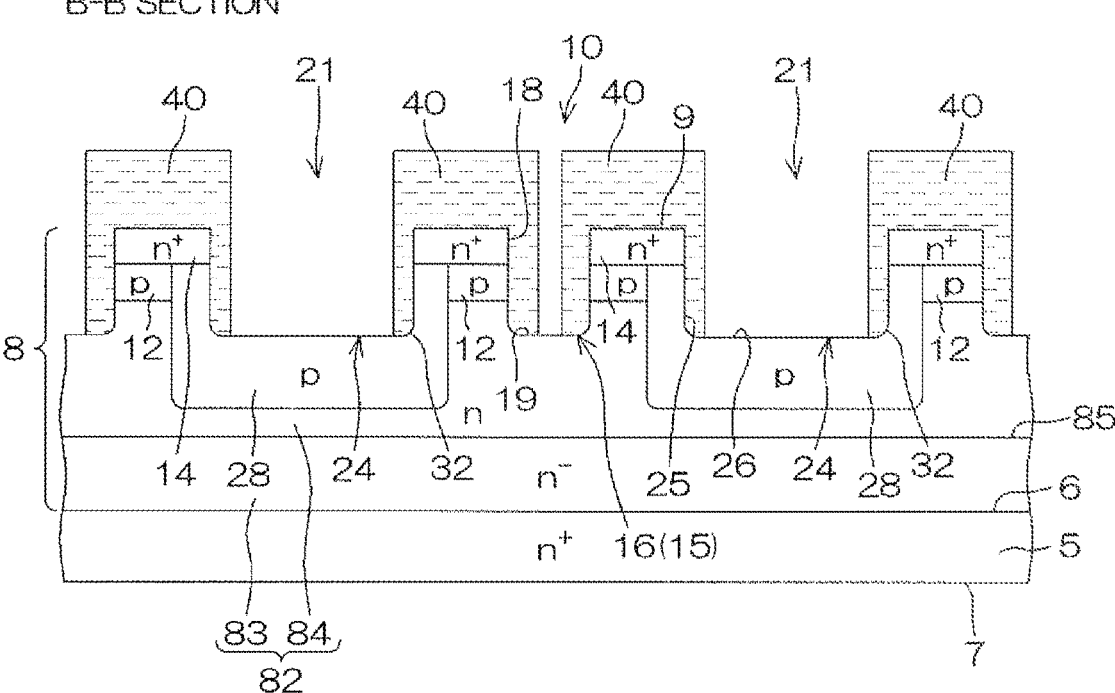

A-A SECTION

B-B SECTION

FIG. 11G
A-A SECTION
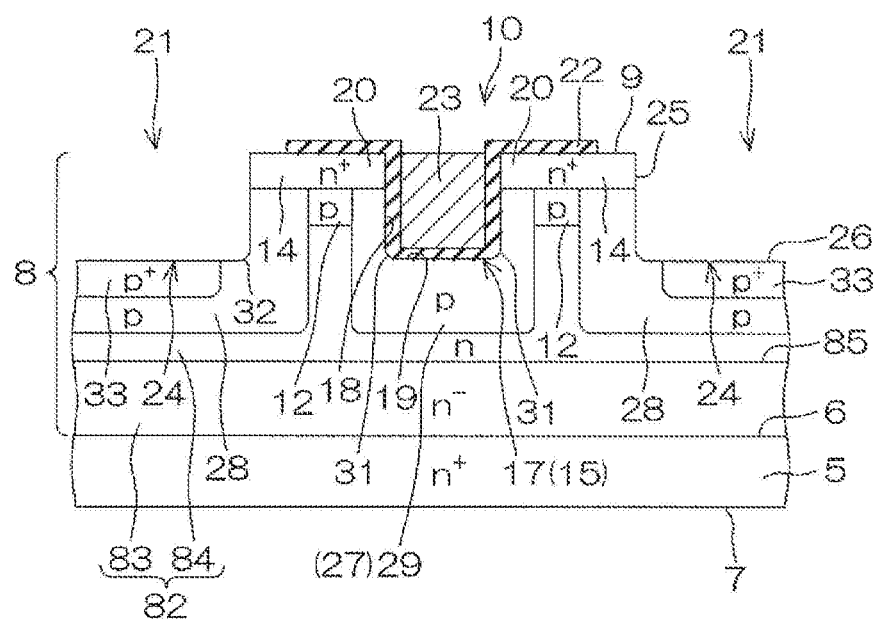
B-B SECTION
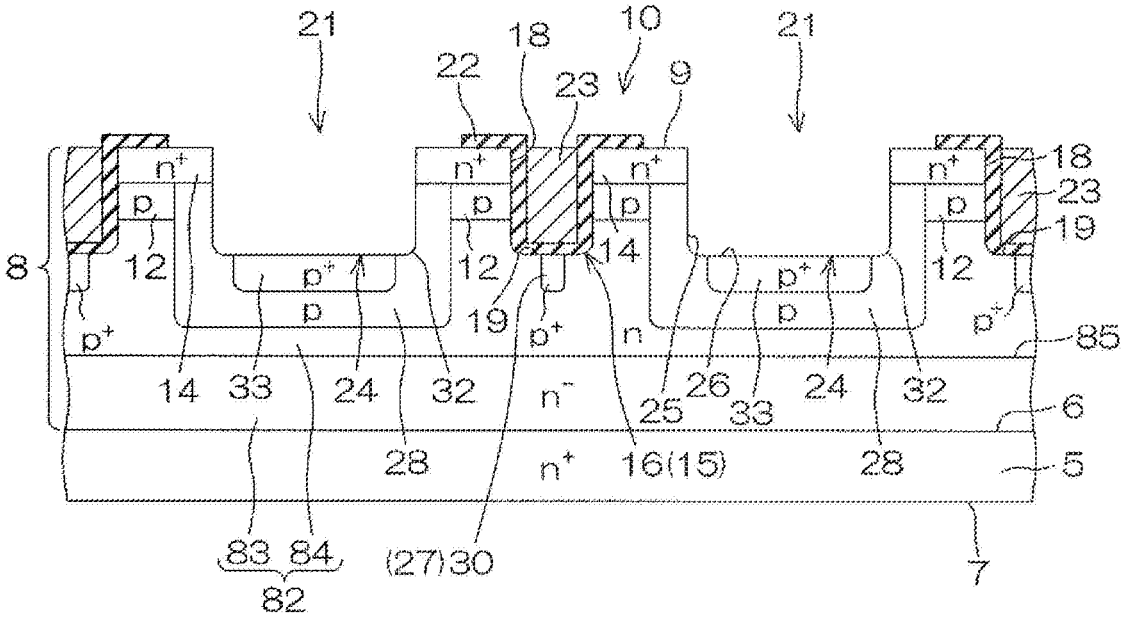

A-A SECTION

B-B SECTION

FIG. 12
A-A SECTION
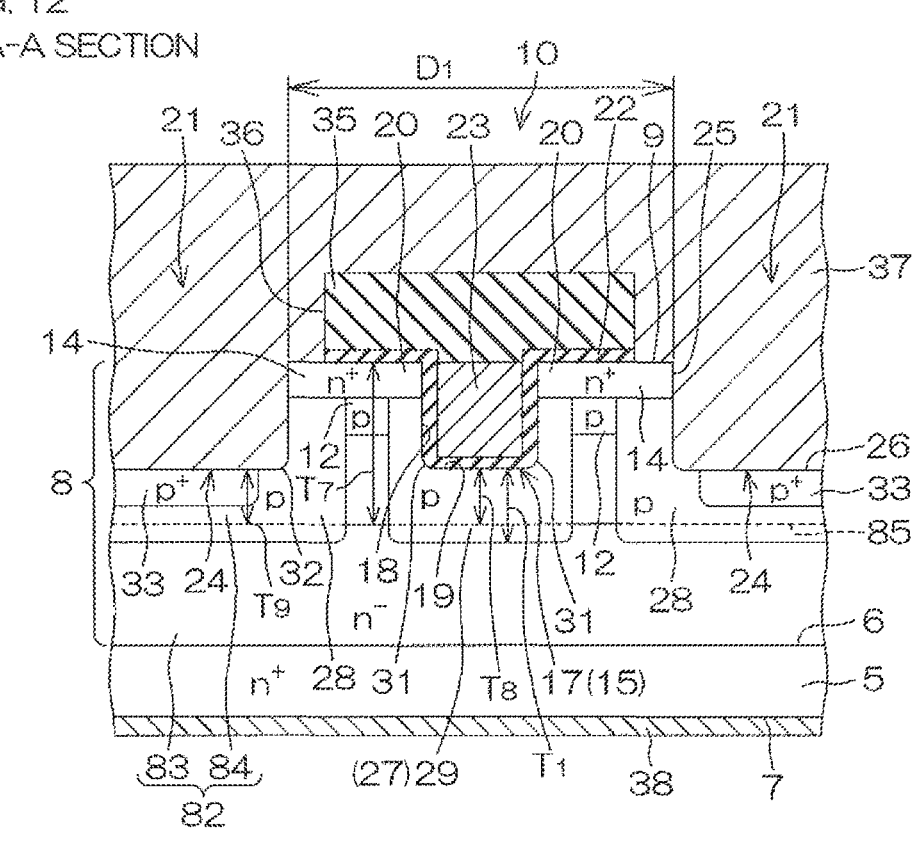
B-B SECTION
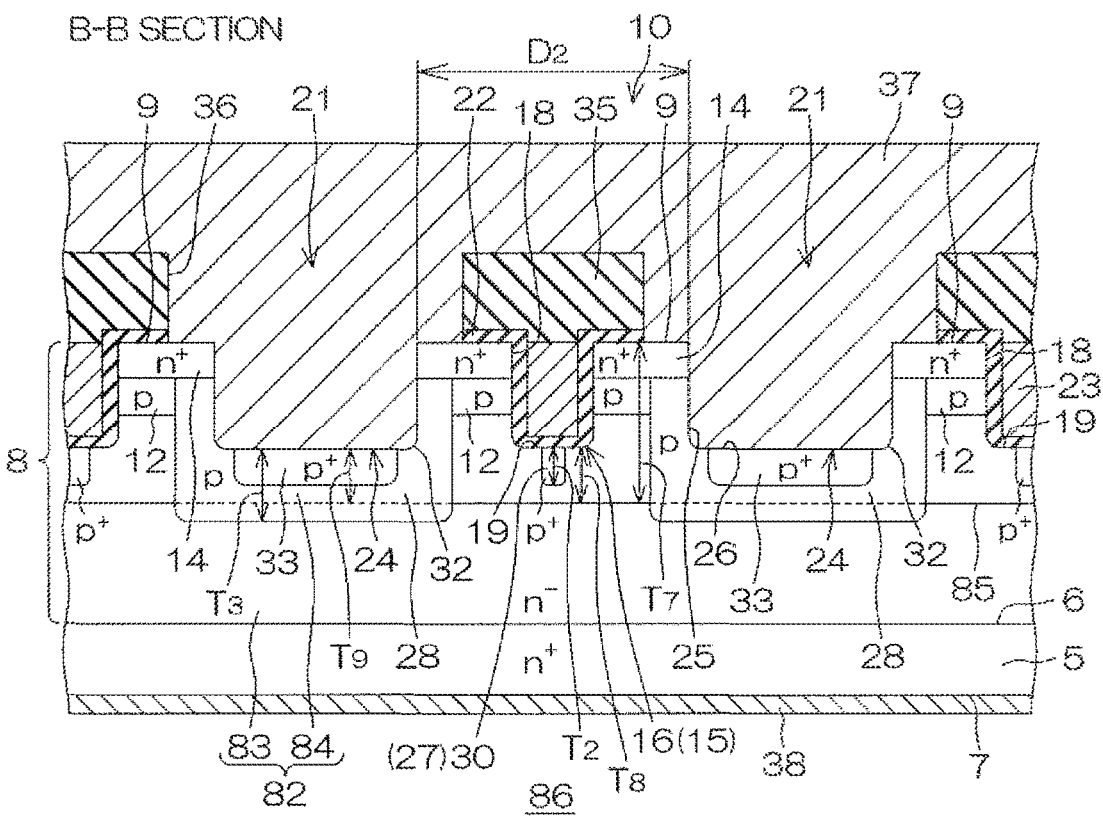

SEMICONDUCTOR DEVICE

CROSS-REFERENCE TO RELATED APPLICATIONS

This application is a Continuation of U.S. application Ser. No. 17/464,296, filed on Sep. 1, 2021, entitled SEMICONDUCTOR DEVICE, which is a Continuation of U.S. application Ser. No. 16/865,267, filed on May 1, 2020, entitled SEMICONDUCTOR DEVICE, issued on Sep. 28, 2021, as U.S. Pat. No. 11,133,377, which is a Continuation of U.S. application Ser. No. 16/050,794, filed on Jul. 31, 2018, entitled SEMICONDUCTOR DEVICE, issued on Jun. 9, 2020, as U.S. Pat. No. 10,680,060, which is a Continuation of U.S. application Ser. No. 15/441,850, filed on Feb. 24, 2017, issued on Sep. 4, 2018, as U.S. Pat. No. 10,068,964, which was a Continuation of U.S. application Ser. No. 14/821,056, filed on Aug. 7, 2015, issued on Apr. 11, 2017, as U.S. Pat. No. 9,620,593, which was a Continuation of U.S. application Ser. No. 13/983,051, filed on Jul. 31, 2013, issued on Sep. 15, 2015, as U.S. Pat. No. 9,136,322, which was a National Stage application of PCT/JP2012/052293, filed on Feb. 1, 2012. The prior U.S. applications, and international application, and the present continuation application claim the benefit of priority of Japanese applications 2011-020730, filed on Feb. 2, 2011, and 2011-101786, filed on Apr. 28, 2011. The disclosures of these prior U.S., international, and foreign applications are incorporated herein by reference.

BACKGROUND ART

In general, a semiconductor power device mainly used for a system, such as a motor control system or a power conversion system, in various power electronics fields is watched with interest.

As this type of semiconductor power device, an SiC semiconductor device having a trench gate structure is proposed, for example.

For example, FIG. 1 of Patent Document 1 discloses a MOS semiconductor device having an SiC substrate (1), an n-type high-resistance layer (2) formed on the SiC substrate (1), a p well layer (3) formed on the n-type high-resistance layer (2), an n$^+$ emitter region (8) formed on a surface layer portion of the p well layer (3), a p$^+$ contact region (12) passing through the n$^+$ emitter region (8) and reaching the p well layer (3), a trench (5) passing through the p well layer (3) from a front surface of the n$^+$ emitter region (8) and reaching the n-type high-resistance layer (2), a gate oxide film (6) formed on an inner surface of the trench (5), and a polysilicon gate electrode (7) embedded in the trench (5) (refer to Patent Document 1, for example).

PRIOR ART

Patent Document

Patent Document 1: Japanese Unexamined Patent Publication No. 2008-294210

SUMMARY OF THE INVENTION

Problems to be Solved by the Invention

An electric field easily concentrates on a bottom portion of a gate trench of a trench gate MOSFET, due to high potential difference between a gate electrode and a drain electrode caused at a turnoff time. The field concentration serves as a factor in breakage of a gate insulating film, and brings about reduction of the breakdown voltage of the MOSFET.

According to studies made by the inventors, it may be possible to relax this type of field concentration by implanting a p-type impurity into the bottom portion of the gate trench.

However, a region where a channel is formed is exposed on an inner surface of the gate trench, and hence implantation of the p-type impurity into a channel region must be prevented when implanting the p-type impurity into the bottom portion of the gate trench. This is because it becomes difficult to control channel characteristics when the p-type impurity is implanted into the channel region.

An object of the present invention is to provide a semiconductor device capable of improving breakdown voltage resistance at an off time and further capable of controlling channel characteristics and a method for producing the same.

Means for Solving the Problems

A semiconductor device according to the present invention for attaining the aforementioned object includes a semiconductor layer made of a wide bandgap semiconductor having a gate trench provided with a sidewall and a bottom wall, a gate insulating film formed on the sidewall and the bottom wall of the gate trench, and a gate electrode embedded in the gate trench to be opposed to the semiconductor layer through the gate insulating film, while the semiconductor layer includes a first conductivity type source region formed to be exposed on the side of a front surface of the semiconductor layer for partially forming the sidewall of the gate trench, a second conductivity type body region formed on a side of the source region closer to a rear surface of the semiconductor layer to be in contact with the source region for partially forming the sidewall of the gate trench, a first conductivity type drift region formed on a side of the body region closer to the rear surface of the semiconductor layer to be in contact with the body region for forming the bottom wall of the gate trench, and a second conductivity type first breakdown voltage holding region selectively formed on an edge portion of the gate trench where the sidewall and the bottom wall intersect with each other in a partial region of the gate trench.

In order to attain the aforementioned object, the inventors have made deep studies as to the mechanism of dielectric breakdown of a gate insulating film at a turn-off time.

More specifically, when voltage rendering a drift region positive (+) is applied between a source region and the drift region functioning as a drain (between a source and a drain) in a state where a semiconductor device is off (i.e., a state where gate voltage is 0 V), an electric field is applied to a gate insulating film interposed between a gate electrode and the drift region. The electric field results from the potential difference between the gate electrode and the drift region. Equipotential surfaces of extremely high potential are distributed on a bottom portion of a gate trench on the basis of the gate electrode (0 V) and the interval between the equipotential surfaces is small, whereby an extremely large electric field is caused. This is such a mechanism that, when voltage approximate to device breakdown voltage is continuously applied between the source and the drain, therefore, a portion of the gate insulating film present on the bottom portion of the gate trench cannot withstand field concentration of the magnitude but causes dielectric breakdown.

According to the inventive semiconductor device, therefore, the first breakdown voltage holding region is formed on the edge portion of the gate trench in the semiconductor device in which the wide bandgap semiconductor (whose bandgap Eg is not less than 2 eV, and preferably 2.5 eV to 7 eV, for example) is employed, in such a vertical structure that the source region and the drift region are vertically arranged through the body region. Thus, a depletion layer resulting from junction (p-n junction) between the first breakdown voltage holding region and the drift region can be generated in the vicinity of the edge portion of the gate trench. Equipotential surfaces of high potential based on the gate electrode can be kept at a distance from the gate insulating film, due to the presence of the depletion layer. Consequently, the electric field applied to the gate insulating film can be diminished, whereby dielectric breakdown can be suppressed.

In the semiconductor device according to the present invention, further, the first breakdown voltage holding region is selectively formed on the edge portion of the gate trench on the partial region of the gate trench. Therefore, no excess second conductivity type impurity is implanted into the body region on a portion of the partial region immediately above the edge portion. Therefore, the concentration of the second conductivity type impurity in the body region can be maintained as designed. Consequently, channel characteristics can be controlled.

Preferably, the impurity concentration in the first breakdown voltage holding region is higher than the impurity concentration in the drift region. According to this structure, the depletion layer resulting from the junction (p-n junction) between the first breakdown voltage holding region and the drift region can be prevented from excessively spreading in the semiconductor layer.

Preferably in the semiconductor device according to the present invention, the gate trench is formed in a latticed manner, the semiconductor layer includes a plurality of unit cells partitioned by the latticed gate trench and provided in the form of polygonal prisms each having a plurality of corner portions, and, in a case where each unit cell has the source region, the body region and the drift region, the first breakdown voltage holding region is selectively formed on a corner edge portion of the gate trench formed on the corner portion of the unit cell.

In the case where the gate trench is formed in the latticed manner and the unit cells provided in the form of polygonal prisms are arrayed on window portions of the latticed gate trench, dielectric breakdown of the gate insulating film particularly easily takes place in the vicinity of the corner edge portion of the gate trench formed on the corner portion of the unit cell. When the first breakdown voltage holding region is formed on the corner edge portion as in the semiconductor device of the aforementioned structure, therefore, dielectric breakdown of the gate insulating film in the vicinity of the corner edge portion can be effectively suppressed.

In the case where the first breakdown voltage holding region is formed on the corner edge portion of the gate trench, the first breakdown voltage holding region may be formed to reach a portion of the body region immediately above the corner edge portion.

In the unit cell provided in the form of a polygonal prism, voltage applied to the gate electrode is so controlled that a channel is formed along a side surface of the unit cell partially forming the sidewall of the gate trench. In other words, no channel is formed on the corner portion of the unit cell, or the quantity of current flowing in such a channel is small even if the same is formed. Therefore, the breakdown preventing effect for the gate insulating film can be further improved while hardly influencing the performance of the device, by forming the first breakdown voltage holding region to reach the portion of the body region immediately above the corner edge portion.

In the case where the first breakdown voltage holding region is formed on the corner edge portion of the gate trench, the first breakdown voltage holding region may be selectively formed on an intersection portion of the latticed gate trench.

Preferably, the semiconductor layer further includes a second conductivity type second breakdown voltage holding region, formed on a bottom wall of a linear portion of the latticed gate trench, having a width narrower than the width of the linear portion.

Even if an electric field generated along the linear portion of the gate trench acts on the gate insulating film, the electric field can be relaxed by a depletion layer resulting from junction (p-n junction) between the second breakdown voltage holding region and the drift region, due to the structure. Consequently, the electric field generated in the gate insulating film can be uniformly relaxed.

Further, the second breakdown voltage holding region is not formed on a sidewall of the linear portion of the gate trench (i.e., a portion where the channel is formed in the unit cell), whereby reduction of the performance of the device can also be prevented.

Preferably, the impurity concentration in the second breakdown voltage holding region is higher than the impurity concentration in the first breakdown voltage holding region. Preferably, the thickness of the second breakdown voltage holding region is smaller than the thickness of the first breakdown voltage holding region.

According to the structure, rise of channel resistance can be suppressed. The thicknesses of the first and second breakdown voltage holding regions denote thicknesses along a direction from the front surface toward the side of the rear surface of the semiconductor layer, for example.

Preferably in the semiconductor device according to the present invention, the semiconductor layer further includes a source trench having a sidewall and a bottom wall, passing through the source region and the body region from the front surface and reaching the drift region, and a second conductivity type third breakdown voltage holding region selectively formed on an edge portion of the source trench where the sidewall and the bottom wall intersect with each other in a partial region of the source trench.

According to the structure, a depletion layer resulting from junction (p-n junction) between the third breakdown voltage holding region and the drift region can be generated in the vicinity of the edge portion of the source trench. Thus, aggregation of equipotential surfaces between the edge portion of the gate trench and the edge portion of the source trench can be prevented. Consequently, the electric field applied to the gate insulating film can be diminished, whereby dielectric breakdown can be suppressed.

Preferably, the drift region includes a first region of a first impurity concentration forming the bottom wall of the gate trench, and a second region of a second impurity concentration smaller than the first impurity concentration formed on a side of the first region closer to the rear surface of the semiconductor layer to be in contact with the first region.

According to the structure, part or the whole of a portion of the drift region in contact with the first breakdown voltage holding region can be turned into a region having the first impurity concentration relatively higher as compared with the remaining region (the second region) of the drift region, by forming the first region on the bottom wall of the gate trench. Thus, spreading of the depletion layer resulting from the p-n junction between the drift region and the first breakdown voltage holding region can be suppressed. Consequently, a path of electrons flowing in a channel (in the vicinity of the interface between the body region and the gate insulating film) is not inhibited by the depletion layer but a path of a sufficient magnitude can be ensured, whereby increase in on-resistance can be prevented.

Further, not the whole drift region is turned into the high-concentration first region but the relatively low-concentration second region is formed on the side of the first region closer to the rear surface of the semiconductor layer, whereby reduction of breakdown voltage resulting from the formation of the first region can be suppressed.

The thickness of the first region may be greater than the thickness of the first breakdown voltage holding region, or may be not more than the thickness of the first breakdown voltage holding region.

When the thickness of the first region>the thickness of the first breakdown voltage holding region, it follows that the first region entirely bears the junction between the drift region and the first breakdown voltage holding region, whereby spreading of the depletion layer resulting from the p-n junction between the drift region (the first region) and the first breakdown voltage holding region can be further suppressed.

When the thickness of the first region the thickness of the first breakdown voltage holding region, on the other hand, the implantation depth of an impurity may be shallow in a case of forming the first region by ion implantation from the front surface of the semiconductor layer, for example, whereby the first region can be easily formed with small implantation energy.

The thickness of the first region denotes a thickness along the direction from the front surface toward the side of the rear surface of the semiconductor layer, for example.

The interface between the first region and the second region may undulate in response to a step caused by partial lowering of the front surface of the semiconductor layer resulting from the formation of the gate trench, or may be at a constant distance from the front surface of the semiconductor layer.

Preferably, a portion of the gate insulating film on the bottom wall of the gate trench is thicker than a portion of the gate insulating film on the sidewall of the gate trench, and a top portion thereof is below the deepest portion of the body region.

Preferably, the front surface of the semiconductor layer is a C plane.

Preferably, the body region is formed by ion implantation.

A method for producing a semiconductor device according to the present invention includes the steps of forming a semiconductor layer, which is a semiconductor layer made of a wide bandgap semiconductor, including a first conductivity type source region formed to be exposed on the side of a front surface thereof, a second conductivity type body region formed on a side of the source region closer to a rear surface to be in contact with the source region, and a first conductivity type drift region formed on a side of the body region closer to the rear surface to be in contact with the body region, forming a gate trench having a sidewall and a bottom wall, passing through the source region and the body region from the front surface of the semiconductor layer and reaching the drift region, and selectively implanting a second conductivity type impurity into an edge portion of the gate trench where the sidewall and the bottom wall intersect with each other in a partial region of the gate trench.

The semiconductor device according to the present invention can be produced by the method.

Preferably, the method for producing a semiconductor device according to the present invention further includes a step of forming a first region of a first impurity concentration forming the bottom wall of the gate trench on the drift region and simultaneously forming a portion of the drift region other than the first region as a second region of a second impurity concentration smaller than the first impurity concentration by implanting a first conductivity type impurity from the front surface of the semiconductor layer after the formation of the gate trench.

Preferably, the step of forming the semiconductor layer includes a step of stacking the drift region, the body region and the source region in this order by epitaxy, the step of growing the drift region includes a step of forming a second region of a second impurity concentration from the side of the rear surface of the semiconductor layer and forming a first region of a first impurity concentration greater than the second impurity concentration on the second region, and the step of forming the gate trench includes a step of forming the gate trench so that the deepest portion of the gate trench reaches an intermediate portion in the thickness direction of the first region.

Preferably, the method for producing a semiconductor device according to the present invention further includes a step, carried out simultaneously with the step of forming the gate trench, of forming a source trench having a sidewall and a bottom wall, passing through the source region and the body region from the front surface of the semiconductor layer and reaching the drift region, and a step, carried out simultaneously with the step of implanting the impurity into the edge portion of the gate trench, of selectively implanting a second conductivity type impurity into an edge portion of the source trench where the sidewall and the bottom wall intersect with each other in a partial region of the source trench.

According to the method, second conductivity type impurity regions can be simultaneously formed on the edge portion of the gate trench and the edge portion of the source trench respectively as the aforementioned first breakdown voltage holding region and the third breakdown voltage holding region. Consequently, a structure for preventing dielectric breakdown of the gate insulating film can be easily prepared.

The edge portion of the source trench may be a portion where the sidewall and the bottom wall intersect with each other on the whole region of the source trench.

The step of forming the semiconductor layer may include a step of forming the body region by performing ion implantation from the front surface of the semiconductor layer after forming the semiconductor layer by epitaxy.

BRIEF DESCRIPTION OF THE DRAWINGS

FIGS. 1A and 1B are schematic plan views of a trench gate MIS transistor according to a first embodiment of the present invention, while FIG. 1A shows a general view and FIG. 1B shows an enlarged internal view respectively.

FIG. 2 illustrates sectional views of the trench gate MIS transistor shown in FIGS. 1A and 1B, and shows cutting planes taken along cutting plane lines A-A and B-B in FIG. 1B respectively.

FIG. 3B is a diagram showing a step subsequent to FIG. 3A.

FIG. 3C is a diagram showing a step subsequent to FIG. 3B.

FIG. 3D is a diagram showing a step subsequent to FIG. 3C.

FIG. 3E is a diagram showing a step subsequent to FIG. 3D.

FIG. 3G is a diagram showing a step subsequent to FIG. 3F.

FIG. 4 is a schematic sectional view showing a first modification of the trench gate MIS transistor shown in FIG. 2.

FIGS. 5A and 5B are schematic plan views showing a second modification of the trench gate MIS transistor shown in FIG. 2, while FIG. 5A shows a general view and FIG. 5B shows an enlarged internal view respectively.

FIG. 7 illustrates sectional views of a trench gate MIS transistor according to a second embodiment of the present invention, and shows cutting planes on the same positions as FIG. 2.

FIG. 9 illustrates schematic sectional views showing a modification of the trench gate MIS transistor shown in FIG. 7.

FIG. 10 illustrates sectional views of a trench gate MIS transistor according to a third embodiment of the present invention, and shows cutting planes on the same positions as FIG. 2.

FIG. 11A is a schematic sectional view showing a part of producing steps for the trench gate MIS transistor shown in FIG. 10, and shows cutting planes on the same positions as FIG. 10.

FIG. 11C is a diagram showing a step subsequent to FIG. 11B.

FIG. 11E is a diagram showing a step subsequent to FIG. 11D.

FIG. 11G is a diagram showing a step subsequent to FIG. 11F.

FIG. 12 is a schematic sectional view showing a modification of the trench gate MIS transistor shown in FIG. 10.

MODES FOR CARRYING OUT THE INVENTION

Embodiments of the present invention are now described in detail with reference to the attached drawings.

Figure 1:
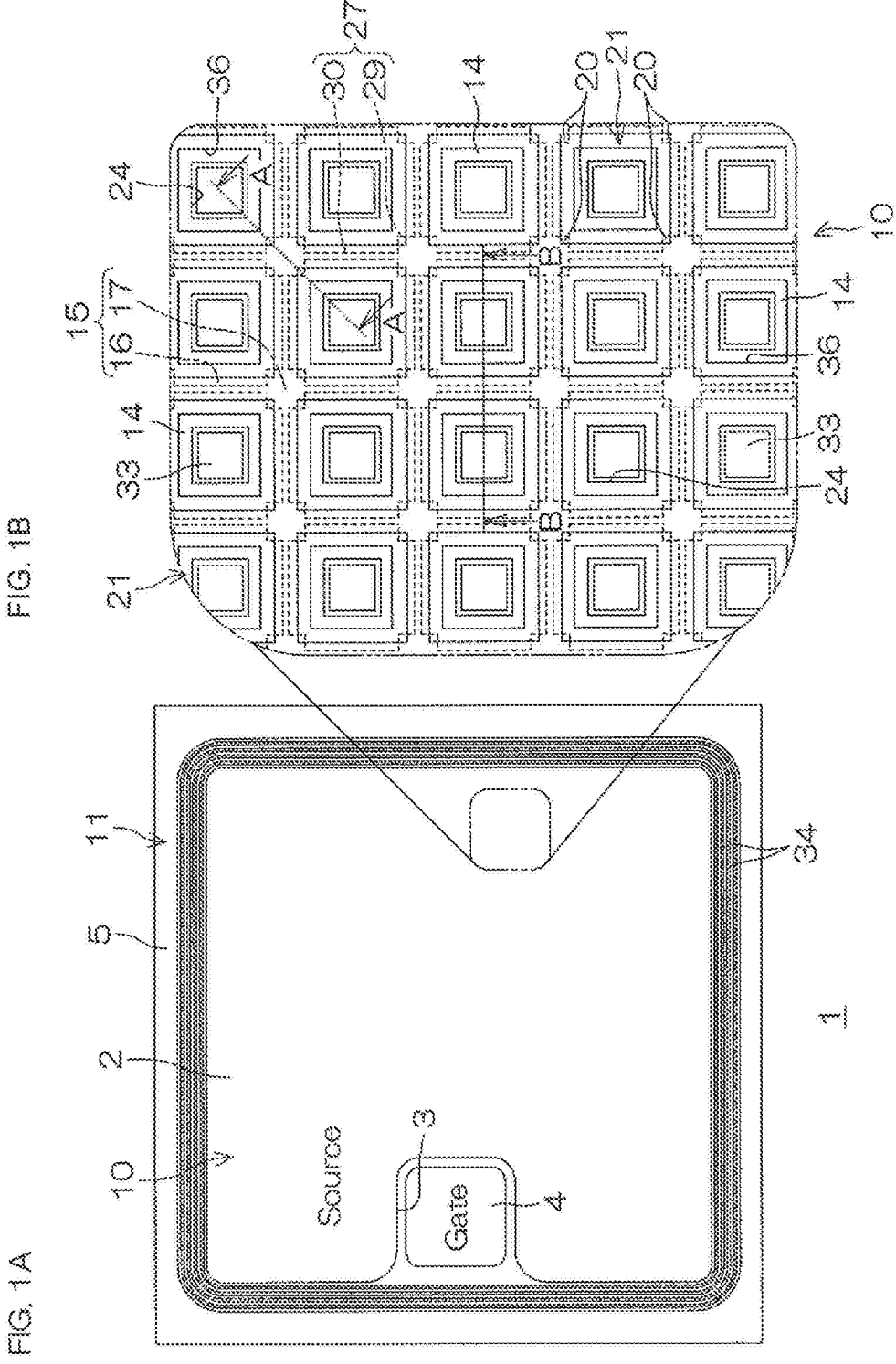

FIGS. 1A and 1B are schematic plan views of a trench gate MIS transistor according to a first embodiment of the present invention, while FIG. 1A shows a general view and FIG. 1B shows an enlarged internal view respectively. FIG. 2 illustrates sectional views of the trench gate MIS transistor shown in FIGS. 1A and 1B, and shows cutting planes taken along cutting plane lines A-A and B-B in FIG. 1B respectively.

An MIS transistor 1 is a trench gate DMISFET (Double diffused Metal Insulator Semiconductor Field Effect Transistor) in which SiC is employed, and has a chip shape square in plan view as shown in FIG. 1A, for example. The lengths of the chip-shaped MIS transistor 1 in the vertical and horizontal directions on the plane of FIG. 1A are about several mm respectively.

A source pad 2 is formed on a front surface of the MIS transistor 1. The source pad 2 is generally in the form of a square having outwardly bent four corners in plan view, and formed to generally cover the whole area of the front surface of the MIS transistor 1. In the source pad 2, a removal region 3 is formed in the vicinity of the center of one side thereof. The removal region 3 is a region where no source pad 2 is formed.

Agate pad 4 is arranged on the removal region 3. An interval is provided between the gate pad 4 and the source pad 2, which are insulated from each other.

The internal structure of the MIS transistor 1 is now described.

The MIS transistor 1 includes an SiC substrate 5 of an $n^+$ type (whose concentration is $1 \times 10^{18}$ to $1 \times 10^{21}$ cm$^{-3}$, for example). The SiC substrate 5 functions as a drain of the MIS transistor 1 according to the embodiment, while a front surface 6 (the upper surface) thereof is an Si plane, and a rear surface 7 (the lower surface) thereof is a C plane.

An SiC epitaxial layer 8 of an $n^-$ type (whose concentration is $1 \times 10^{15}$ to $1 \times 10^{17}$ cm$^{-3}$, for example) lower in concentration than the SiC substrate 5 is stacked on the front surface 6 of the SiC substrate 5. The thickness of the SiC epitaxial layer 8 as a semiconductor layer is 1 μm to 100 μm, for example. The SiC epitaxial layer 8 is stacked on the SiC substrate 5 by the so-called epitaxy. The SiC epitaxial layer 8 formed on the front surface 6 which is the Si plane is grown on the Si plane serving as a major growth surface. Therefore, a front surface 9 of the SiC epitaxial layer 8 formed by the growth is an Si plane, similarly to the front surface 6 of the SiC substrate 5. Alternatively, the front surface 9 of the SiC epitaxial layer 8 may be a C plane. If the front surface 9 is a C plane, bottom walls 19 (described later) of gate trenches 15 parallel to the front surface 9 can be formed as C planes. Consequently, the oxidation rate of the bottom walls 19 with respect to sidewalls 18 of the gate trenches 15 can be enlarged, whereby portions of a gate insulating film 22 present on the bottom walls 19 can be thickened. Therefore, an electric field applied to the gate insulating film 22 on bottom portions of the gate trenches 15 can be relaxed, whereby dielectric breakdown on the bottom portions of the gate trenches 15 can be prevented.

The MIS transistor 1 is provided with an active region 10 arranged on a central portion of the SiC epitaxial layer 8 in plan view to function as the MIS transistor 1 and a transistor peripheral region 11 surrounding the active region 10, as shown in FIG. 1A.

In the active region 10, a large number of body regions 12 of a p type (whose concentration is $1.0 \times 10^{16}$ cm$^{-3}$ to $1.0 \times 10^{19}$ cm$^{-3}$, for example) are arrayed on a surface layer portion of the SiC epitaxial layer 8 in the form of a matrix at a constant pitch in a row direction and a column direction. Each body region 12 is in the form of a square in plan view, and lengths thereof in the vertical and horizontal directions on the plane of FIG. 1B are about 7.2 μm respectively, for example. The body regions 12 can be formed by ion implantation as in a step shown in FIG. 3A described later, or can be formed by epitaxy. In a case where the same are formed by ion implantation, a channel length or the concentration in the body regions 12 can be controlled with excellent in-plane uniformity, whereby stabilization of characteristics and improvement of a yield can be attained.

On the other hand, a region on a side of the SiC epitaxial layer 8 closer to the SiC substrate 5 than the body regions 12 is an n$^-$-type drift region 13 where the state after the epitaxy is maintained.

In the respective body regions 12, source regions 14 of an n$^+$ type (whose concentration is $1 \times 10^{18}$ to $1 \times 10^{21}$ cm$^{-3}$, for example) are formed generally on the whole areas thereof on the side of the front surface 9.

The gate trenches 15 passing through the respective source regions 14 and the body regions 12 from the front surface 9 of the SiC epitaxial layer 8 and reaching the drift region 13 are formed in a latticed manner, to surround the respective body regions 12.

More specifically, each gate trench 15 includes linear portions 16 linearly extending between adjacent body regions 12 in the respective ones of the row direction and the column direction along four side surfaces of each body region 12, and intersectional portions 17 where the linear portions 16 extending in the row direction and the linear portions 16 extending in the column direction intersect with one another. When noting the body regions 12 arrayed in two rows and two columns in plan view, the intersectional portions 17 are portions in the form squares in plan view surrounded by inner corners of the four arrayed body regions 12 and partitioned by extensional lines of four sides of each body region 12. The gate trenches 15 have U-shaped sections where the sidewalls 18 and bottom walls 19 opposed to one another are continuous with one another through bent surfaces.

Thus, a large number of unit cells 21 in the form of rectangular parallelepipeds (squares in plan view) each having four corner portions 20 are formed on the SiC epitaxial layer 8 in respective window portions surrounded by the latticed gate trenches 15. In the unit cells 21, the depth direction of the gate trenches 15 is a gate length direction, and a peripheral direction of the respective unit cells 21 orthogonal to the gate length direction is a gate width direction.

The gate insulating film 22 made of SiO$_2$ is formed on inner surfaces of the gate trenches 15, to cover the whole areas thereof.

In the gate insulating film 22, portions of the gate insulating film 22 on the bottom walls 19 are thicker than portions of the gate insulating film 22 on the sidewalls 18, and a top surface thereof is not more than the deepest portions of the body regions 12 (the interfaces between the body regions 12 and the drift region 13), although not strictly appearing in FIG. 2. More specifically, the thickness of the portions on the sidewalls 18 is about 1000 Å, while the thickness of the portions on the bottom walls 19 is 1500 to 3000 Å. Thus, the electric field applied to the gate insulating film 22 on the bottom portions of the gate trenches 15 can be relaxed, whereby dielectric breakdown on the bottom portions of the gate trenches 15 can be prevented.

Gate electrodes 23 are embedded in the gate trenches 15 by filling up the inner side of the gate insulating film 22 with a polysilicon material doped with an n-type impurity in a high concentration. Thus, such a vertical MIS transistor structure is constituted that the source regions 14 and the drift region 13 are separately arranged in the vertical direction perpendicular to the front surface 9 of the SiC epitaxial layer 8 through the body regions 12.

Source trenches 24 having square shapes in plan view, passing through the respective source regions 14 and the body regions 12 from the front surface 9 of the SiC epitaxial layer 8 and reaching the drift region 13 are formed on central portions of the respective unit cells 21. The depth of the source trenches 24 is identical to that of the gate trenches 15 according to the embodiment. The source trenches 24 also have U-shaped sections where sidewalls 25 and bottom walls 26 opposed to one another are continuous with one another through bent surfaces, similarly to the gate trenches 15.

The SiC epitaxial layer 8 is provided with p-type gate breakdown voltage holding regions 27 and source breakdown voltage holding regions 28 as third breakdown voltage holding regions formed by implanting a p-type impurity into the SiC epitaxial layer 8.

The gate breakdown voltage holding regions 27 are formed along the latticed gate trenches 15, and integrally include first regions 29 as first breakdown voltage holding regions formed on the intersection portions 17 of the gate trenches 15 and second regions 30 as second breakdown voltage holding regions formed on the linear portions 16 of the gate trenches 15.

The first regions 29 are formed to reach the body regions 12 immediately above corner edge portions 31 through the bottom walls 19 of the gate trenches 15 on the intersection portions 17 and the corner edge portions 31 of the gate trenches 15 formed under respective corner portions 20 of four unit cells 21 facing each intersection portion 17 from the corresponding bottom walls 19. In other words, the first regions 29 are provided in the form of squares slightly larger than the intersection portions 17 of the gate trenches 15 in plan view, and respective corners thereof enter the respective corner portions 20 of the four unit cells 21 facing each intersection portion 17. The concentration in the first regions 29 is higher than the concentration in the body regions 12, higher than the concentration in the drift region 13, and $1 \times 10^{17}$ to $9 \times 10^{19}$ cm$^{-3}$, for example. A thickness T$_1$ of the first regions 29 along the direction from the bottom surfaces of the gate trenches 15 toward the SiC substrate 5 is about 0.8 μm, for example.

The second regions 30 are provided in the form of straight lines of a constant width linking the centers of respective sides of the intersection portions 17 adjacent to one another in plan view, and have a width (1.8 μm, for example) narrower than the width of the linear portions 16 (the distance (1 μm, for example) between side surfaces of the gate trenches 15 facing one another). The concentration in the second regions 30 is higher than the concentration in the body regions 12, higher than that in the first regions 29, and $2\times10^{17}$ to $1\times10^{20}$ cm$^{-3}$, for example. A thickness $T_2$ of the second regions 30 along the direction from the bottom surfaces of the gate trenches 15 toward the SiC substrate 5 is smaller than the thickness $T_1$ of the first regions 29 (i.e., $T_1>T_2$), and about 0.7 μm, for example.

The source breakdown voltage holding regions 28 are formed to reach the body regions 12 partially forming the sidewalls 25 of the source trenches 24 through the bottom walls 26 of the source trenches 24 and edge portions 32 of the source trenches 24 where the bottom walls 26 and the sidewalls 25 intersect with one another. The concentration in the source breakdown voltage holding regions 28 is identical to that in the first regions 29 of the gate breakdown voltage holding regions 27 ($1\times10^{17}$ to $9\times10^{19}$ cm$^{-3}$, for example). A thickness $T_3$ of the source breakdown voltage holding regions 28 in the direction from the bottom surfaces of the source trenches 24 toward the Si substrate 5 is identical to the thickness $T_1$ of the first regions 29 of the gate breakdown voltage holding regions 27 (about 0.8 μm, for example).

On central portions of the bottom walls 26 of the respective source trenches 24, p$^+$-type body contact regions 33 (whose concentration is $1.0\times10^{18}$ cm$^{-3}$ to $2.0\times10^{21}$ cm$^{-3}$, for example) are formed on surface layer portions of the source breakdown voltage holding regions 28.

In the transistor peripheral region 11, a plurality of (according to the embodiment, four) p-type guard rings 34 are formed on the surface layer portion of the SiC epitaxial layer 8 at an interval from the active region 10, to surround the unit cells 21 (the active region 10) arrayed in the form of a matrix. The guard rings 34 can be formed through the same ion implantation step as a step of forming the p-type body regions 12.

The respective guard rings 34 are provided in the form of quadrangular rings in plan view along the outer periphery of the MIS transistor 1 in plan view.

An interlayer dielectric film 35 made of SiO$_2$ is stacked on the SiC epitaxial layer 8, to cover the gate electrodes 23.

Contact holes 36 larger in diameter than the source trenches 24 are formed in the interlayer dielectric film 35 and the gate insulating film 22. Thus, the whole of the source trenches 24 (i.e., the sidewalls 25 and the bottom walls 26 of the source trenches 24) of the respective unit cells 21 and peripheral edge portions of the source trenches 24 on the front surface 9 of the SiC epitaxial layer 8 are exposed in the contact holes 36, and steps responsive to the vertical difference between the front surface 9 and the bottom walls 26 are formed.

A source electrode 37 is formed on the interlayer dielectric film 35. The source electrode 37 collectively enters the source trenches 24 of all unit cells 21 through the respective contact holes 36, and is in contact with the body contact regions 33, the source breakdown voltage holding regions 28, the body regions 12 and the source regions 14 successively from the side of the bottoms of the source trenches 24 in the respective unit cells 21. In other words, the source electrode 37 serves as a wire common to all unit cells 21.

An interlayer dielectric film (not shown) is formed on the source electrode 37, and the source electrode 37 is electrically connected to the source pad 2 (see FIG. 1 A) through the interlayer dielectric film (not shown). On the other hand, the gate pad 4 (see FIG. 1 A) is electrically connected to the gate electrodes 23 through a gate wire (not shown) drawn on the interlayer dielectric film (not shown).

The source electrode 37 has such a structure that a Ti/TiN layer and an Al layer are stacked successively from the side in contact with the SiC epitaxial layer 8, for example.

A drain electrode 38 is formed on the rear surface 7 of the SiC substrate 5, to cover the whole area thereof. The drain electrode 38 serves as an electrode common to all unit cells 21. Such a multilayer structure (Ti/Ni/Au/Ag) that Ti, Ni, Au and Ag are stacked successively from the side of the SiC substrate 5 can be applied to the drain electrode 38, for example.

FIGS. 3A to 3H are schematic sectional views showing parts of producing steps for the trench gate MIS transistor shown in FIG. 2, and show cutting planes on the same positions as FIG. 2.

Figure 3A:
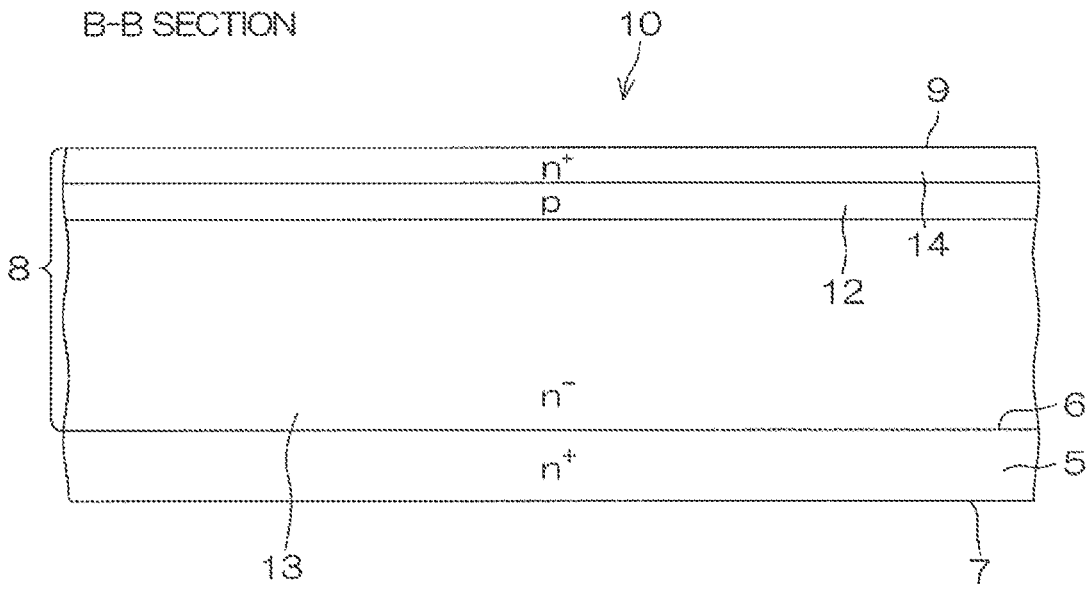
FIG. 3A is a schematic sectional view showing a part of producing steps for the trench gate MIS transistor shown in FIG. 2, and shows cutting planes on the same positions as FIG. 2.

In order to produce the MIS transistor 1, an SiC crystal is grown on the front surface 6 (the Si plane) of the SiC substrate 5 by epitaxy such as CVD, LPE or MEB while doping the same with an n-type impurity (N (nitrogen), P (phosphorus), As (arsenic) or the like, for example), as shown in FIG. 3A. Thus, the SiC epitaxial layer 8 of the n$^-$ type is formed on the SiC substrate 5.

Then, a p-type impurity (Al (aluminum), B (boron) or the like, for example) is implanted into the SiC epitaxial layer 8 from the front surface 9 of the SiC epitaxial layer 8.

Then, an n-type impurity is implanted into the SiC epitaxial layer 8 from the front surface 9 of the SiC epitaxial layer 8.

Then, the SiC epitaxial layer 8 is heat-treated at 1400° C. to 2000° C., for example. Thus, ions of the p-type impurity and the n-type impurity implanted into the surface layer portion of the SiC epitaxial layer 8 are activated, and the body regions 12, the source regions 14 and the guard rings 34 are simultaneously formed in response to the implanted portions. Further, the drift region 13 maintaining the state after the epitaxy is formed on a base layer portion of the SiC epitaxial layer 8.

Then, the SiC epitaxial layer 8 is etched by employing a mask having openings on regions for forming the gate trenches 15 and the source trenches 24, as shown in FIG. 3B. Thus, the SiC epitaxial layer 8 is dry-etched from the surface 9 (the Si plane), and the gate trenches 15 and the source trenches 24 are simultaneously formed. Along with this, the large number of unit cells 21 are formed on the SiC epitaxial layer 8. As etching gas, mixed gas (SF$_6$/O$_2$ gas) containing SF$_6$ (sulfur hexafluoride) and O$_2$ (oxygen) or mixed gas (SF$_6$/O$_2$/HBr gas) containing SF$_6$, O$_2$ and HBr (hydrogen bromide) can be employed, for example.

Then, a first resist 39 having openings exposing the intersection portions 17 of the gate trenches 15 and the source trenches 24 is formed on the SiC epitaxial layer 8, as shown in FIG. 3C.

Then, a p-type impurity is implanted toward the intersection portions 17 of the gate trenches 15 and the source trenches 24 exposed from the openings of the first resist 39, as shown in FIG. 3D. At this time, neither the sidewalls 18 of the gate trenches 15 (the intersection portions 17) nor the sidewalls 25 of the source trenches 24 are covered with the first resist 39, whereby it follows that the p-type impurity is implanted also into the sidewalls 18 and 25. Thereafter the SiC epitaxial layer 8 is heat-treated at 1400° C. to 2000° C., for example. Thus, ions of the p-type impurity implanted into the drift region 13 are activated, and the first regions 29 of the gate breakdown voltage holding regions 27 and the source breakdown voltage holding regions 28 are simultaneously formed.

Then, a second resist 40 having openings on regions for forming the second regions 30 of the gate breakdown voltage holding regions 27 and the body contact regions 33 is formed on the SiC epitaxial layer 8, as shown in FIG. 3E. Thus, it follows that the sidewalls 18 and the bottom walls 19 of the intersection portions 17 of the gate trenches 15 as well as peripheral edge portions of the sidewalls 25 and the bottom walls 26 of the source trenches 24 are covered with the second resist 40.

Figure 3F:
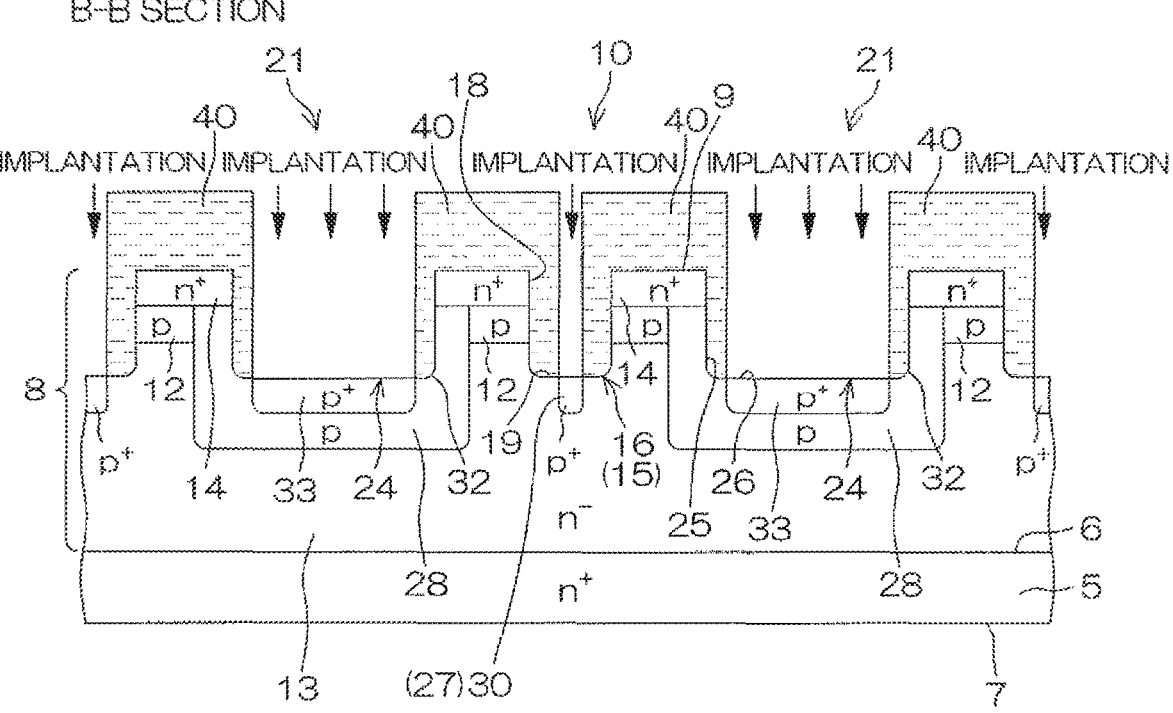
FIG. 3F is a diagram showing a step subsequent to FIG. 3E.

Then, a p-type impurity is implanted toward the linear portions 16 of the gate trenches 15 and central portions of the bottom walls 26 of the source trenches 24 exposed from the openings of the second resist 40, as shown in FIG. 3F. At this time, the sidewalls 18 and the bottom walls 19 as well as the peripheral edge portions of the sidewalls 25 and the bottom walls 25 are protected by the second resist 40, whereby implantation of the p-type impurity into these portions can be prevented. Thereafter the SiC epitaxial layer 8 is heat-treated at 1400° C. to 2000° C., for example. Thus, ions of the p-type impurity implanted into the drift region 13 are activated, and the second regions 30 of the gate breakdown voltage holding regions 27 and the body contact regions 33 are simultaneously formed.

Then, an $SiO_2$ material is deposited from above the SiC epitaxial layer 8 by CVD, as shown in FIG. 3G. Thus, the gate insulating film 22 is formed.

Then, a doped polysilicon material is deposited from above the SiC epitaxial layer 8 by CVD. The deposition of the polysilicon material is continued at least until the gate trenches 15 and the source trenches 24 are filled up. Thereafter the deposited polysilicon material is etched back until the etched-back surface is flush with the front surface 9 of the SiC epitaxial layer 8. Then, only the polysilicon material remaining in the source trenches 24 is removed by dry etching. Thus, the gate electrodes 23 made of the polysilicon material remaining in the gate trenches 15 are formed.

Figure 3H:
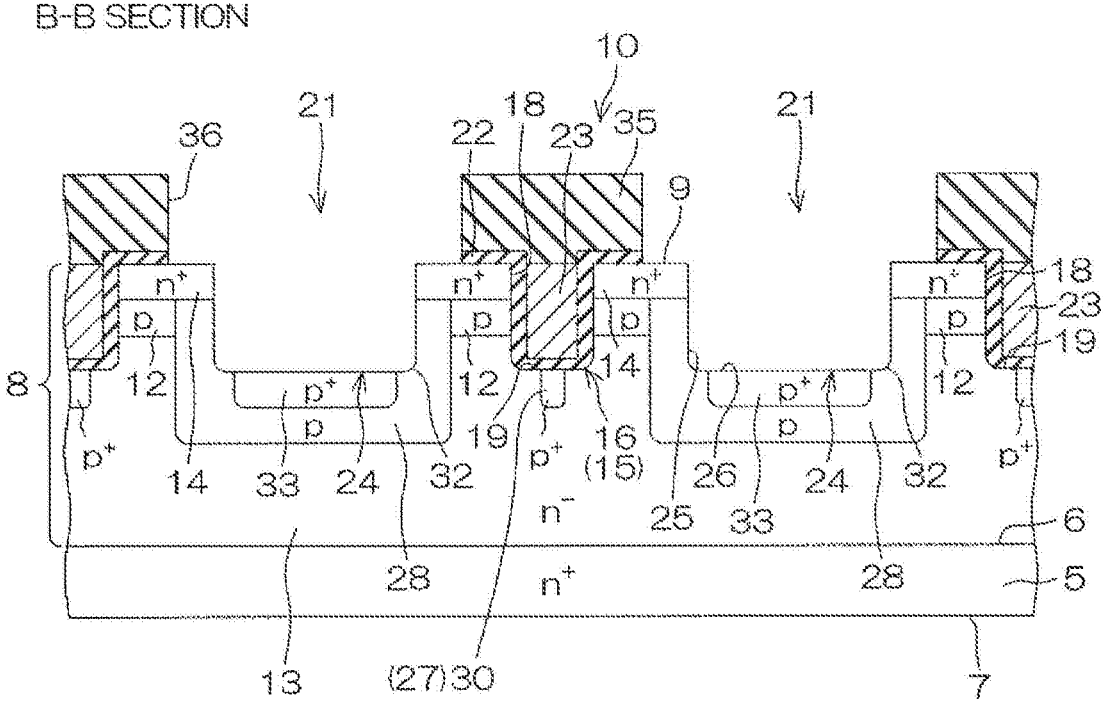
FIG. 3H is a diagram showing a step subsequent to FIG. 3G.

Then, an $SiO_2$ material is deposited from above the SiC epitaxial layer 8 by CVD, as shown in FIG. 3H. Thus, the interlayer dielectric film 35 is formed. Then, the interlayer dielectric film 35 and the gate insulating film 22 are continuously patterned by a well-known patterning technique. Thus, the contact holes 36 are formed in the interlayer dielectric film 35 and the gate insulating film 22.

Thereafter the source electrodes 37, the drain electrodes 38 etc. are formed, whereby the MIS transistor 1 shown in FIG. 2 is obtained.

In the MIS transistor 1, drain voltage is applied between the source pad 2 (the source electrode 37) and the drain electrode 38 (between a source and a drain) in a state grounding the source pad 2 (i.e., the source electrode 37 is at 0 V). When voltage of not less than gate threshold voltage is applied to the gate pad 4 (the gate electrode 23) in this state, channels are formed along the body regions 12 forming the sidewalls of the respective unit cells 21. Thus, current flows from the drain electrode 38 to the source electrode 37, and the respective unit cells 21 enter ON states.

When the respective unit cells 21 are brought into OFF states (i.e., a state where gate voltage is 0 V) while the voltage is still applied between the source and the drain, on the other hand, an electric field is applied to the gate insulating film 22 interposed between the gate electrode 23 and the SiC epitaxial layer 8.

The electric field results from the potential difference between the gate electrode 23 and the SiC epitaxial layer 8. Equipotential surfaces of extremely high potential are distributed on the bottom walls 19 of the gate trenches 15 on the basis (0 V) of the gate electrode 23 and the interval between the equipotential surfaces is small, whereby an extremely high electric field is caused. When the drain voltage is 900 V, for example, equipotential surfaces of 900 V are distributed in the vicinity of the rear surface 7 of the SiC substrate 5 in contact with the drain electrode 38 and a voltage drop takes place as directed from the rear surface 7 of the SiC substrate 5 toward the side of the front surface 9 of the SiC epitaxial layer 8, while equipotential surfaces of about several 10 V are distributed in the vicinity of the bottom walls 19 of the gate trenches 15. Therefore, an extremely high electric field directed toward the side of the gate electrode 23 is caused on the bottom walls 19 of the gate trenches 15. Particularly in the case where the gate trenches 15 are formed in a latticed manner and the unit cells 21 in the form of quadrangular prisms are arrayed on the window portions of the latticed gate trenches 15 as in the embodiment, dielectric breakdown of the gate insulating film 22 particularly easily takes place in the vicinity of the corner edge portions 31 of the gate trenches 15 formed on the respective corner portions 20 of the unit cells 21.

More specifically, the distance $D_1$ (see an A-A section in FIG. 2) between the source trenches 24 adjacent to one another on diagonal lines of the intersection portions 17 of the gate trenches 15 is greater as compared with the distance $D_2$ (see a B-B section in FIG. 2) between the source trenches 24 adjacent to one another through the linear portions 16 of the gate trenches 15 (for example, $D_1$ is 1.4 times $D_2$ according to the embodiment). Therefore, the equipotential surfaces enter spaces immediately under the corner edge portions 31 of the gate trenches 15 having relatively wide spaces, to result in aggregation of the equipotential surfaces. Consequently, dielectric breakdown of the gate insulating film 22 particularly easily takes place in the vicinity of the corner edge portions 31 of the gate trenches 15.

In the MIS transistor 1 according to the embodiment, therefore, the gate breakdown voltage holding regions 27 (the first regions 29) are formed on the corner edge portions 31 of the gate trenches 15. Thus, depletion layers resulting from junction (p-n junction) between the first regions 29 and the drift region 13 can be generated in the vicinity of the corner edge portions 31 of the gate trenches 15. In the MIS transistor 1, further, the source breakdown voltage holding regions 28 are formed on the edge portions 32 of the source trenches 24 formed on the central portions of the respective unit cells 21. Therefore, depletion layers resulting from junction (p-n junction) between the source breakdown voltage holding regions 28 and the drift region 13 can be spread toward the corner edge portions 31 of the gate trenches 15 surrounding the source trenches 24.

The equipotential surfaces can be prevented from entering the spaces between the corner edge portions 31 of the gate trenches 15 and the edge portions 32 of the source trenches 24, and can be separated from the gate insulating film 22, due to the presence of the depletion layers. Consequently, aggregation of the equipotential surfaces in the vicinity of the corner edge portions 31 of the gate trenches 15 can be prevented. Consequently, the electric field applied to the gate insulating film 22 can be diminished, whereby dielectric breakdown can be suppressed. Further, the concentration in the first regions 29 is higher than the concentration in the drift region 13, whereby the depletion layers resulting from the junction (the p-n junction) between the first regions 29 and the drift region 13 can be prevented from excessively spreading in the SiC epitaxial layer 8.

While the first regions 29 are formed to reach the body regions 12 immediately above the corner edge portions 31 through the corner edge portions 31 in the MIS transistor 1, no channels are formed on the corner portions 20 of the unit cells 21, or the amount of current flowing through such channels is small even if the same are formed. Therefore, the breakdown preventing effect for the gate insulating film 22 can be further improved while hardly influencing the performance of the device by forming the gate breakdown voltage holding regions 27 (the first regions 29) to reach the portions of the body regions 12 immediately above the corner edge portions 31.

On the other hand, the gate breakdown voltage holding regions 27 (the second regions 30) of the width smaller than the width of the linear portions 16 are formed on the linear portions 16 of the gate trenches 15. Thus, depletion layers resulting from junction (p-n junction) between the second regions 30 and the drift region 13 can be generated along the linear portions 16 of the gate trenches 15. Therefore, electric fields formed immediately under the linear portions 16 of the gate trenches 15 can be relaxed by the depletion layers. Consequently, an electric field generated on the gate insulating film 22 can be uniformly relaxed over the whole.

Further, the gate breakdown voltage holding regions 27 (the second regions 30) are not formed on the side walls 18 of the linear portions 16 of the gate trenches 15 (i.e., portions of the unit cells 21 where channels are formed). Therefore, it is also possible to precisely control channel characteristics.

In addition, the concentration in the second regions 30 is higher than the concentration in the first regions 29, and the thickness $T_2$ of the second regions 30 is smaller than the thickness $T_1$ of the first regions 29 ($T_1 > T_2$), whereby rise of channel resistance can also be prevented.

According to the aforementioned producing method, the gate breakdown voltage holding regions 27 and the source breakdown voltage holding regions 28 can be simultaneously formed. Consequently, the structure of the MIS transistor 1 for preventing dielectric breakdown of the gate insulating film 22 can be easily prepared.

FIG. 7 illustrates sectional views of a trench gate MIS transistor according to a second embodiment of the present invention, and shows cutting planes on the same positions as FIG. 2. Referring to FIG. 7, portions corresponding to the respective portions shown in FIG. 2 are denoted by reference numerals identical to the reference numerals assigned to the respective portions, and description is omitted as to the portions.

While the drift region 13 has been formed only by the low-concentration region of the n⁻-type (whose concentration is $1 \times 10^{15}$ to $1 \times 10^{17}$ cm⁻³, for example) in the aforementioned first embodiment, a drift region 72 of an MIS transistor 71 according to the second embodiment has such a structure that two layers whose impurity concentrations are different from each other are stacked along the thickness direction of an SiC epitaxial layer 8, and includes an n⁻-type low-concentration region 73 as an example of a lower layer side second region in contact with a front surface 6 of an SiC substrate 5 and an n-type high-concentration region 74 as an example of an upper layer side first region formed on the low-concentration region 73. The concentration in the low-concentration region 73 is $1 \times 10^{15}$ to $1 \times 10^{17}$ cm⁻³, for example, and the concentration in the high-concentration region 74 is $2 \times 10^{15}$ to $1 \times 10^{18}$ cm⁻³, for example.

An interface 75 (an upper end of the low-concentration region 73) between the low-concentration region 73 and the high-concentration region 74 undulates in response to steps caused by partial lowering of a front surface of the SiC epitaxial layer 8 resulting from formation of gate trenches 15 and source trenches 24. Thus, the high-concentration region 74 on the side of a front surface 9 is so formed as to form the front surface 9 of the SiC epitaxial layer 8, sidewalls 18 and bottom walls 19 of the gate trenches 15 and sidewalls 25 and bottom walls 26 of the source trenches 24. On the other hand, the low-concentration region 73 has low step portions 76 on portions opposed to the bottom walls 19 of the gate trenches 15 and the bottom walls 26 of the gate trenches 24 and has high step portions 77 on portions opposed to top portions (the front surface 9) of unit cells 21, for example, in the respective unit cells 21.

The interface 75 so undulates that thicknesses $T_4$, $T_5$ and $T_6$ of the high-concentration region 74 along a direction from the respective ones of the top portions (the front surface 9) of the unit cells 21, bottom surfaces of the gate trenches 15 and bottom surfaces of the source trenches 24 toward the SiC substrate 5 are uniform. The thicknesses $T_4$, $T_5$ and $T_6$ are greater than thicknesses $T_1$ and $T_2$ of gate breakdown voltage holding regions 27 and a thickness $T_3$ of source breakdown voltage holding regions 28. Thus, the gate breakdown voltage holding regions 27 (first regions 29 and second regions 30) and the source breakdown voltage holding regions 28 are covered with the high-concentration region 74.

FIGS. 8A to 8I are schematic sectional views showing parts of producing steps for the trench gate MIS transistor shown in FIG. 7, and show cutting planes on the same positions as FIG. 7.

Figure 8A:
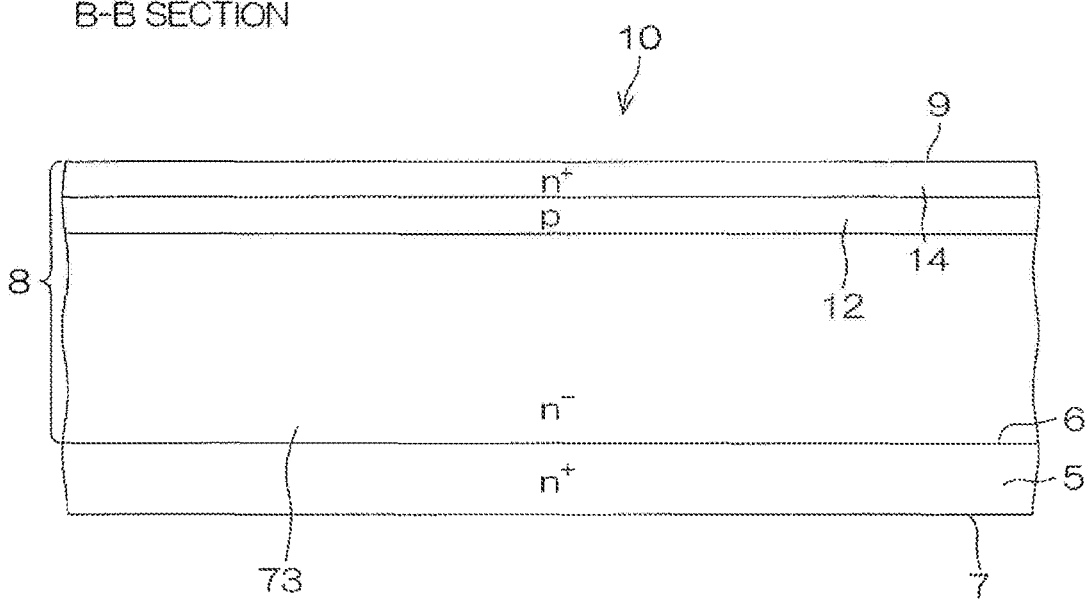
FIG. 8A is a schematic sectional view showing a part of producing steps for the trench gate MIS transistor shown in FIG. 7, and shows cutting planes on the same positions as FIG. 7.
Figure 8:
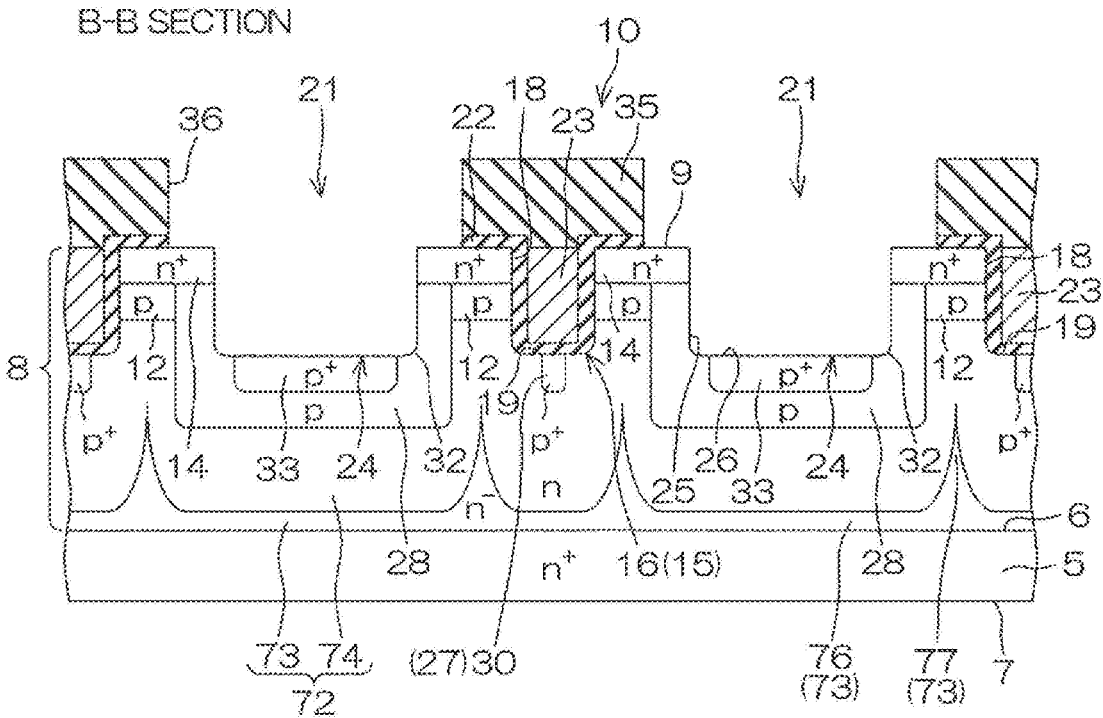
FIG. 8B is a diagram showing a step subsequent to FIG. 8A.
FIG. 8C is a diagram showing a step subsequent to FIG. 8B.
FIG. 8D is a diagram showing a step subsequent to FIG. 8C.
FIG. 8E is a diagram showing a step subsequent to FIG. 8D.
FIG. 8F is a diagram showing a step subsequent to FIG. 8E.
FIG. 8G is a diagram showing a step subsequent to FIG. 8F.
FIG. 8H is a diagram showing a step subsequent to FIG. 8G.
FIG. 8I is a diagram showing a step subsequent to FIG. 8H.

In order to produce the MIS transistor 71, steps similar to those in FIGS. 3A and 3B are carried out as shown in FIGS. 8A and 8B, whereby the n⁻-type SiC epitaxial layer 8 is formed on the SiC substrate 5, and body regions 12, source regions 14, guard rings 34 and the drift region 72 are simultaneously formed on the SiC epitaxial layer 8. Thereafter the SiC epitaxial layer 8 is dry-etched from the front surface 9 (an Si plane), and the gate trenches 15 and the source trenches 24 are simultaneously formed.

Then, an n-type impurity is implanted into the SiC epitaxial layer 8 over the whole area of the front surface (including respective bottom surfaces of the gate trenches 15 and the source trenches 24) thereof without forming a mask on the front surface 9 of the SiC epitaxial layer 8, as shown in FIG. 8C. Then, the SiC epitaxial layer 8 is heat-treated at 1400° C. to 2000° C., for example. Thus, ions of the n-type impurity implanted into the SiC epitaxial layer 8 are activated, and the high-concentration region 74 is formed on the upper side of the drift region 72. Further, the low-concentration region 73 maintaining the impurity concentration in the drift region 72 is formed on the lower side of the drift region 72.

Thereafter steps similar to those in FIGS. 3C to 3H are carried out as shown in FIGS. 8D to 8I, whereby the MIS transistor 71 shown in FIG. 7 is obtained.

As hereinabove described, functions/effects similar to those of the aforementioned MIS transistor 1 can be developed also according to the MIS transistor 71.

In the MIS transistor 71, further, the high-concentration region 74 is so formed as to form the bottom walls 19 of the gate trenches 15 where the p-type gate breakdown voltage holding regions 27 are formed and the bottom walls 26 of the source trenches 24 where the p-type source breakdown voltage holding regions 28 are formed, and the high-concentration region 74 covers the gate breakdown voltage holding regions 27 and the source breakdown voltage holding regions 28.

Thus, the high-concentration region 74 can be made to bear p-n junction between the gate breakdown voltage holding regions 27 and the source breakdown voltage holding regions 28 in the drift region 72. Therefore, spreading of depletion layers generated from the p-n junction can be suppressed. Consequently, paths of electrons flowing through channels are not inhibited by the depletion layers but paths of sufficient magnitudes can be ensured, whereby increase of on-resistance can be prevented.

The thicknesses $T_4$, $T_5$ and $T_6$ of the high-concentration region 74 may be not more than thicknesses $T_1$ and $T_2$ of gate breakdown voltage holding regions 27 and a thickness $T_3$ of source breakdown voltage holding regions 28, as in an MIS transistor 78 of FIG. 9, for example. In this case, respective bottom portions of the gate breakdown voltage holding regions 27 and the source breakdown voltage holding regions 28 project beyond interfaces 75 toward the side of a low-concentration region 73, and are covered with the low-concentration region 73. Such a structure can be formed by performing ion implantation at a time of forming the high-concentration region 74 with lower energy than the case of the MIS transistor 71. Therefore, the high-concentration region 74 can be easily formed with low energy.

FIG. 10 illustrates sectional views of a trench gate MIS transistor according to a third embodiment of the present invention, and shows cutting planes on the same positions as FIG. 2. Referring to FIG. 10, portions corresponding to the respective portions shown in FIG. 2 are denoted by reference numerals identical to the reference numerals assigned to the respective portions, and description is omitted as to the portions.

While the drift region 13 has been formed by only the low-concentration region of the n⁻ type (whose concentration is $1\times10^{15}$ to $1\times10^{17}$ cm⁻³, for example) in the aforementioned first embodiment, a drift region 82 of an MIS transistor 81 according to the third embodiment has such a structure that two layers whose impurity concentrations are different from each other are stacked along the thickness direction of an SiC epitaxial layer 8, and includes an n⁻-type low-concentration region 83 as an example of a lower layer side second region in contact with a front surface 6 of an SiC substrate 5 and an n-type high-concentration region 84 as an example of an upper layer side first region formed on the low-concentration region 83, similarly to the second embodiment. The concentration in the low-concentration region 83 is $1\times10^{15}$ to $1\times10^{17}$ cm⁻³, for example, and the concentration in the high-concentration region 84 is $2\times10^{15}$ to $1\times10^{18}$ cm⁻³, for example.

The high-concentration region 84 is so formed as to form a front surface 9 of the SiC epitaxial layer 8, sidewalls 18 and bottom walls 19 of gate trenches 15 and sidewalls 25 and bottom walls 26 of source trenches 24.

An interface 85 (an upper end of the low-concentration region 83) between the low-concentration region 83 and the high-concentration region 84 has a constant height along top portions (the front surface 9) of unit cells 21, regardless of steps caused by partial lowering of the front surface of the SiC epitaxial layer 8 resulting from the formation of the gate trenches 15 and the source trenches 24.

The interface 75 has the constant height, whereby thicknesses $T_7$, $T_8$ and $T_9$ of the high-concentration region 84 along a direction from the respective ones of the top portions (the front surface 9) of the unit cells 21, bottom surfaces of the gate trenches 15 and bottom surfaces of the source trenches 24 toward the SiC substrate 5 are so set that $T_7$ is greater than $T_8$ and $T_9$ ($T_7 > T_8 = T_9$). This results from the steps caused by the partial lowering of the front surface of the SiC epitaxial layer 8.

Further, the thicknesses $T_8$ and $T_9$ of the high-concentration region 84 are greater than thicknesses $T_1$ and $T_2$ of gate breakdown voltage holding regions 27 and a thickness $T_3$ of source breakdown voltage holding regions 28. Thus, the gate breakdown voltage holding regions 27 (first regions 29 and second regions 30) and the source breakdown voltage holding regions 28 are covered with the high-concentration region 74.

FIGS. 11A to 11H are schematic sectional views showing parts of producing steps for the trench gate MIS transistor shown in FIG. 10, and show cutting planes on the same positions as FIG. 10.

In order to produce the MIS transistor 81, an SiC crystal is grown (the concentration is $2\times10^{15}$ to $1\times10^{11}$ cm⁻³, for example) on the front surface 6 (an Si plane) of the SiC substrate 5 by epitaxy such as CVD, LPE or MEB while doping the same with an n-type impurity, as shown in FIG. 11A. Thus, the n⁻-type low-concentration region 83 is formed on the SiC substrate 5. Then, the dose is enlarged ($2\times10^{15}$ to $1\times10^{19}$ cm⁻³, for example), and the SiC crystal is further grown while doping the front surface 6 with the n-type impurity. Thus, the high-concentration region 84 is formed and the SiC epitaxial layer 8 is formed.

Then, a p-type impurity is implanted into the SiC epitaxial layer 8 from the front surface 9 of the SiC epitaxial layer 8, and an n-type impurity is thereafter implanted into the SiC epitaxial layer 8 from the front surface 9 of the SiC epitaxial layer 8. Then, the SiC epitaxial layer 8 is heat-treated at 1400° C. to 2000° C., for example. Thus, ions of the p-type impurity and the n-type impurity implanted into a surface layer portion of the SiC epitaxial layer 8 are activated, and body regions 12, source regions 14 and guard rings 34 are simultaneously formed in response to the implanted portions.

Figure 11B:
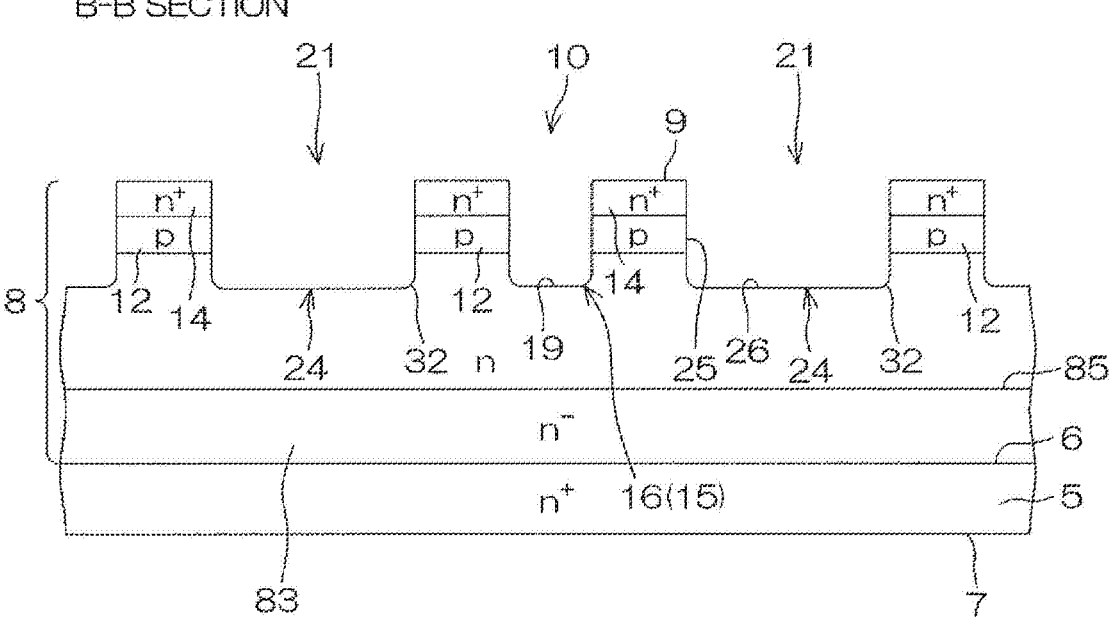
FIG. 11B is a diagram showing a step subsequent to FIG. 11A.

Then, a step similar to that in FIG. 3B is carried out as shown in FIG. 11B, whereby the gate trenches 15 and the source trenches 24 whose deepest portions reach intermediate portions in the thickness direction of the high-concentration region 84 respectively are simultaneously formed.

Then, a step similar to that in FIG. 3C is carried out as shown in FIG. 11C, whereby a first resist 39 having openings exposing intersection portions 17 of the gate trenches 15 and the source trenches 24 is formed on the SiC epitaxial layer 8.

Figure 11D:
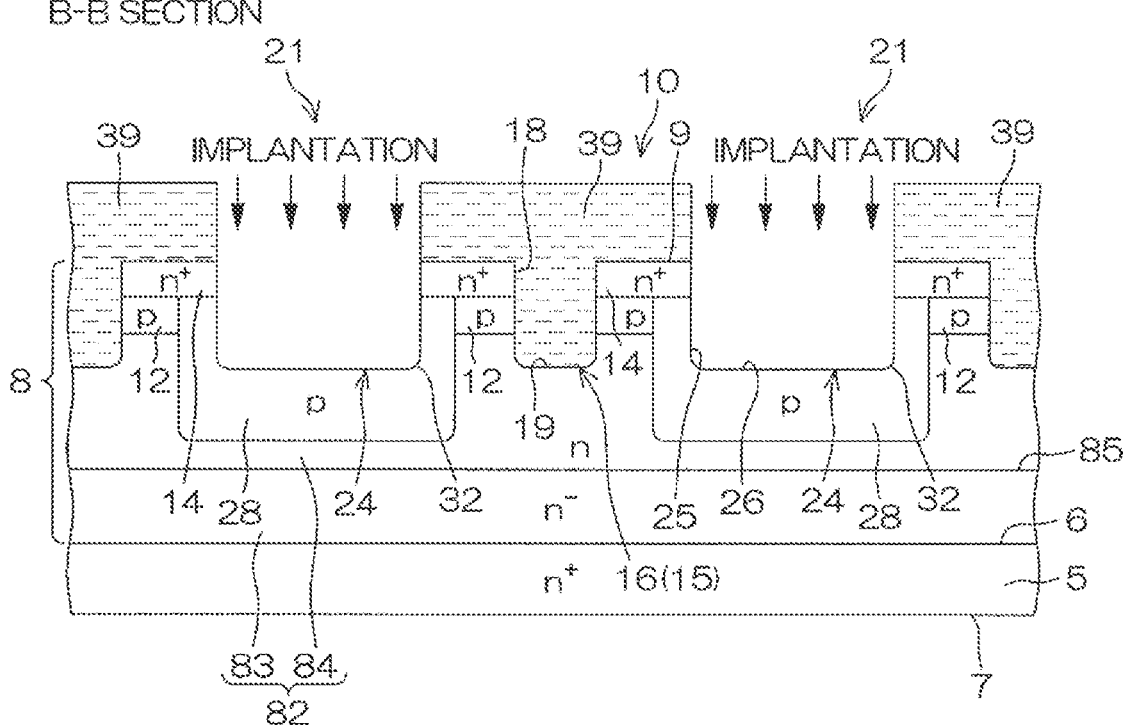
FIG. 11D is a diagram showing a step subsequent to FIG. 11C.
Figure 11F:
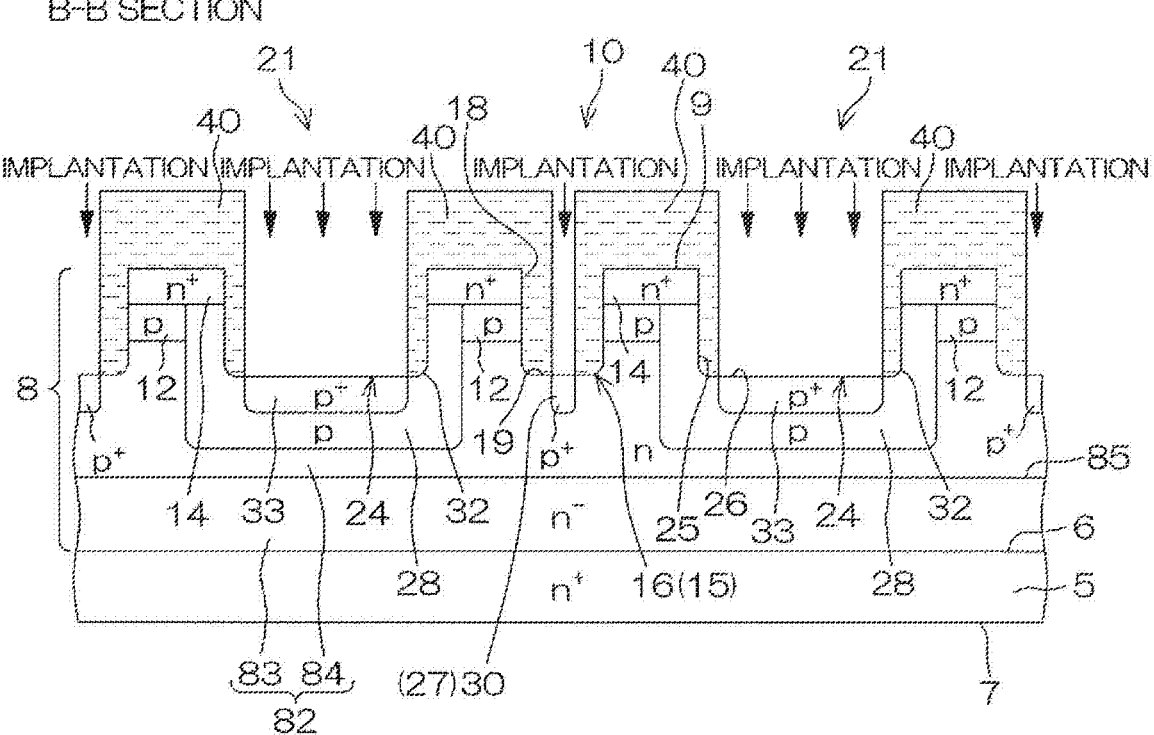
FIG. 11F is a diagram showing a step subsequent to FIG. 11E.

Then, steps similar to those in FIGS. 3D to 3F are carried out as shown in FIGS. 11D to 11F, whereby the first regions 29 of the gate breakdown voltage holding regions 27, the source breakdown voltage holding regions 28, the second regions 30 of the gate breakdown voltage holding regions 27 and body contact regions 33 whose deepest portions reach intermediate portions in the thickness direction of the high-concentration region 84 respectively are formed.

Figure 11H:
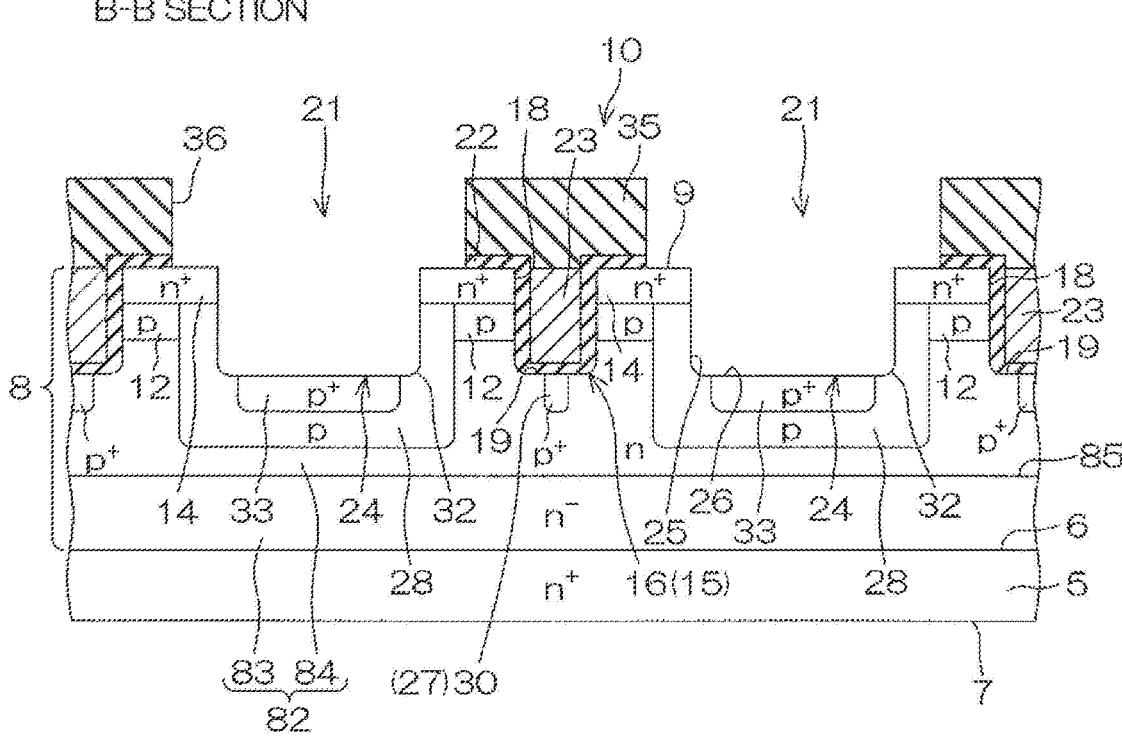
FIG. 11H is a diagram showing a step subsequent to FIG. 11G.

Thereafter steps similar to those in FIGS. 3G to 3H are carried out as shown in FIGS. 11G to 11H, whereby the MIS transistor 81 shown in FIG. 10 is obtained.

As hereinabove described, functions/effects similar to those of the aforementioned MIS transistor 1 can be developed also according to the MIS transistor 81.

In the MIS transistor 81, further, the high-concentration region 84 is so formed as to form the bottom walls 19 of the gate trenches 15 where the p-type gate breakdown voltage holding regions 27 are formed and the bottom walls 26 of the source trenches 24 where the p-type source breakdown voltage holding regions 28 are formed, and the high-concentration region 84 covers the gate breakdown voltage holding regions 27 and the source breakdown voltage holding regions 28.

Thus, the high-concentration region 84 can be made to bear p-n junction between the gate breakdown voltage holding regions 27 and the source breakdown voltage holding regions 28 in the drift region 82. Therefore, spreading of depletion layers generated from the p-n junction can be suppressed. Consequently, paths of electrons flowing through channels are not inhibited by the depletion layers but paths of sufficient magnitudes can be ensured, whereby increase of on-resistance can be prevented.

The thicknesses $T_8$ and $T_9$ of the high-concentration region 84 may be not more than thicknesses $T_1$ and $T_2$ of gate breakdown voltage holding regions 27 and a thickness $T_3$ of source breakdown voltage holding regions 28, as in an MIS transistor 86 of FIG. 12, for example. In this case, respective bottom portions of the gate breakdown voltage holding regions 27 and the source breakdown voltage holding regions 28 project beyond interfaces 85 toward the side of a low-concentration region 83, and are covered with the low-concentration region 83.

While the embodiments of the present invention have been described, the present invention may be embodied in other ways.

For example, structures inverting the conductivity types of the respective semiconductor portions of the MIS transistors 1, 41, 51, 71, 78, 81 and 86 may be employed. For example, the p-type portions may be of the n-type, and the n-type portions may be of the p-type in the MIS transistor 1.

Further, the layers constituting the semiconductor layers in the MIS transistors 1, 41, 51, 71, 78, 81 and 86 are not restricted to the epitaxial layers made of SiC, but may be layers made of a wide bandgap semiconductor other than SiC, such as GaN (bandgap $Eg_{GaN}$=about 3.4 eV) or diamond (bandgap $Eg_{dia}$=about 5.5 eV), for example.

The source trenches 24 may be omitted, as in an MIS transistor 41 shown in FIG. 4. In this case, body contact regions 33 can be formed to pass through source regions 14 and body regions 12 from a front surface 9 of an SiC epitaxial layer 8 and to reach a drift region 13.

Figures 5A, 5B:
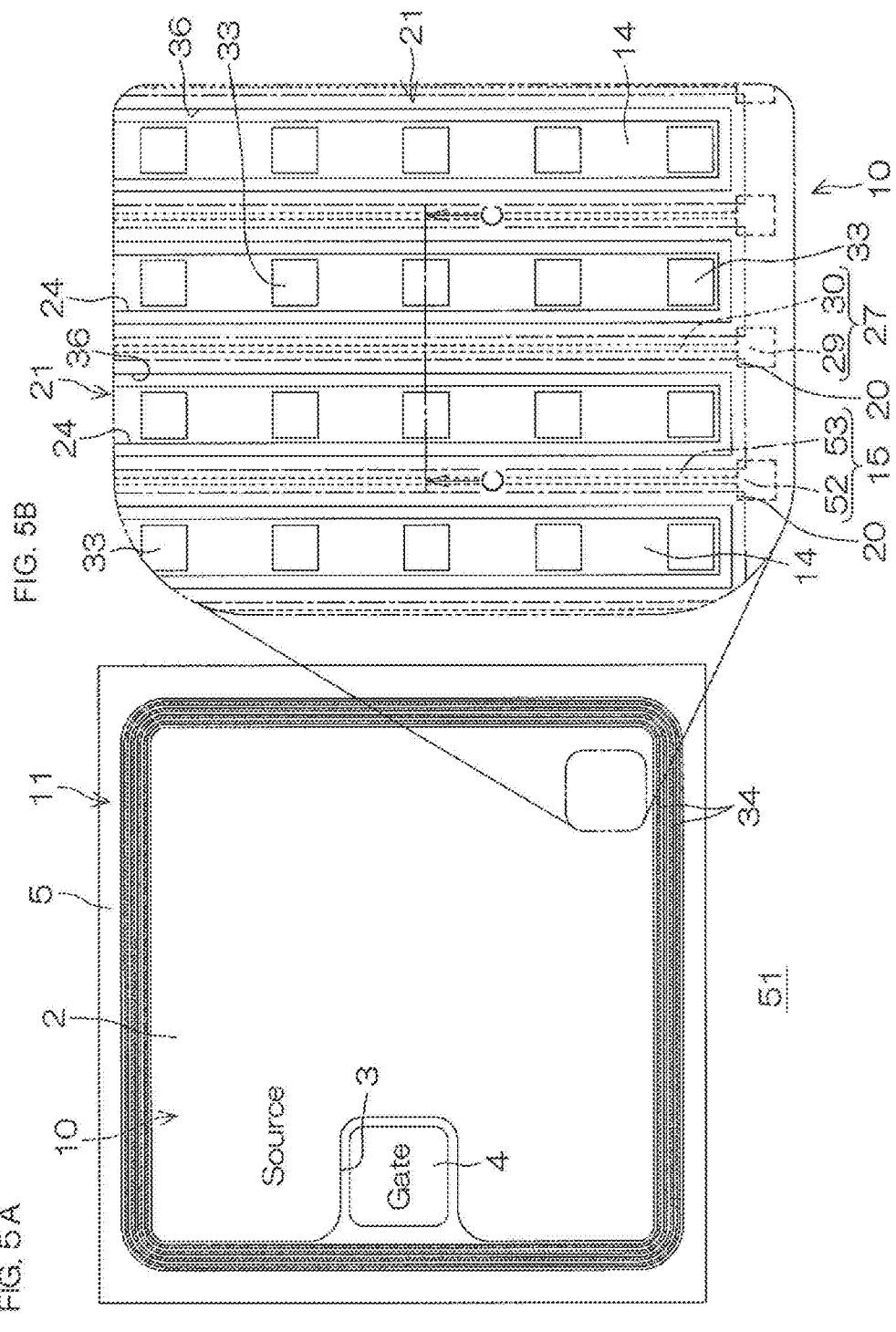
Figure 6:
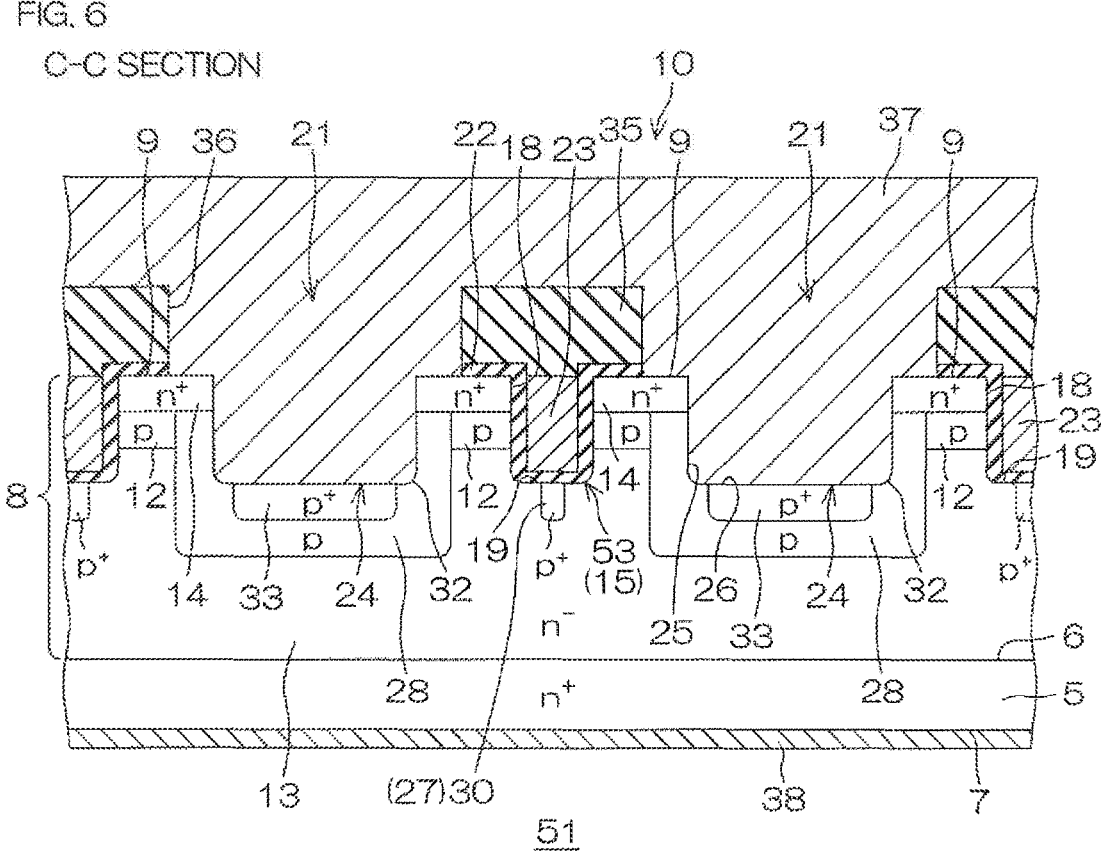
FIG. 6 is a sectional view of the trench gate MIS transistor shown in FIGS. 5A and 5B, and shows a cutting plane along a cutting plane line C-C in FIG. 5B.

The arrangement mode of the body regions 12 is not restricted to the matrix shape shown in FIG. 1B, but may be a striped shape as in an MIS transistor 51 shown in FIGS. 5A, 5B and 6, for example. In this case, body contact regions 33 may be plurally formed at intervals from one another along the longitudinal direction of source trenches 24.

In the MIS transistor 51 shown in FIGS. 5A, 5B and 6, gate breakdown voltage holding regions 27 are formed along linear gate trenches 15 extending between the respective ones of the striped body regions 12. First regions 29 of the gate breakdown voltage holding regions 27 are formed on end portions 52 of the gate trenches 15. On the other hand, second regions 30 of the gate breakdown voltage holding regions 27 are formed on linear portions 53 of the gate trenches 15.

The respective unit cells 21 are not restricted to the shape of rectangular parallelepipeds (quadrangular prisms), but may be in the form of other polygonal prisms such as triangular prisms, pentagonal prisms or hexagonal prisms, for example.

A semiconductor power device according to the present invention can be built into a power module employed for an inverter circuit constituting a driving circuit for driving an electric motor utilized as a power source for an electric car (including a hybrid car), a train or an industrial robot, for example. The same can also be built into a power module employed for an inverter circuit converting power generated by a solar cell, a wind turbine generator or still another power generator (particularly a private power generator) to match with power of a commercial power source.

The embodiments of the present invention are merely specific examples employed for clarifying the technical contents of the present invention, and the present invention is not to be interpreted limitedly to the specific examples, but the spirit and scope of the present invention are to be limited only by the appended claims.

Further, the elements shown in the respective embodiments of the present invention can be combined with one another in the range of the present invention.

This application corresponds to Japanese Patent Application No. 2011-20730 filed with the Japan Patent Office on Feb. 2, 2011, and Japanese Patent Application No. 2011-101786 filed with the Japan Patent Office on Apr. 28, 2011, the disclosures of which are incorporated herein by reference.

DESCRIPTION OF THE REFERENCE NUMERALS

1 . . . MIS transistor, 8 . . . SiC epitaxial layer, 9 . . . front surface (of SiC epitaxial layer), 12 . . . body region, 13 . . . drift region, 14 . . . source region, 15 . . . gate trench, 16 . . . linear portion (of gate trench), 17 . . . intersection portion (of gate trench), 18 . . . sidewall (of gate trench), 19 . . . bottom wall (of gate trench), 20 . . . corner portion (of unit cell), 21 . . . unit cell, 22 . . . gate insulating film, 23 . . . gate electrode, 24 . . . source trench, 25 . . . sidewall (of source trench), 26 . . . bottom wall (of source trench), 27 . . . gate breakdown voltage holding region, 28 . . . source breakdown voltage holding region, 29 . . . first region, 30 . . . second region, 31 . . . corner edge portion (of gate trench), 32 . . . edge portion (of source trench), 37 . . . source electrode, 38 . . . drain electrode, 41 . . . MIS transistor, 51 . . . MIS transistor, 52 . . . end portion (of gate trench), 53 . . . linear portion (of gate trench), 71 . . . MIS transistor, 72 . . . drift region, 73 . . . low-concentration region, 74 . . . high-concentration region, 75 . . . interface, 78 . . . MIS transistor, 81 . . . MIS transistor, 82 . . . drift region, 83 . . . low-concentration region, 84 . . . high-concentration region, 85 . . . interface, 86 . . . MIS transistor

What is claimed is:

1. A semiconductor device comprising:
an SiC semiconductor layer having a gate trench provided with a sidewall and a bottom wall;
a gate insulating film formed on the sidewall and the bottom wall of the gate trench; and
a gate electrode embedded in the gate trench to be opposed to the SiC semiconductor layer through the gate insulating film, wherein
the SiC semiconductor layer includes:
a first conductivity type source region formed on a front surface side of the SiC semiconductor layer;
a second conductivity type body region formed on the front surface side of the SiC semiconductor layer such that the second conductivity type body region is in contact with the first conductivity type source region;

a source breakdown voltage holding region that is partially in contact with the second conductivity type body region;

a first conductivity type drift region formed on a rear surface side of the SiC semiconductor layer such that the first conductivity type drift region is in contact with the source breakdown voltage holding region; and a second conductivity type gate breakdown voltage holding region formed at the bottom wall of the gate trench, the second conductivity type gate breakdown voltage holding region having a width narrower than a width of the gate trench, wherein the source breakdown voltage holding region extends deeper into semiconductor layer than the bottom wall of the gate trench in a thickness direction of the SiC semiconductor layer, such that a bottom portion of the source breakdown voltage holding region is located closer to the rear surface of the SiC semiconductor layer than the bottom wall of the gate trench, and the first conductivity type drift region has a laminated structure including a low-concentration region and a high-concentration region in the thickness direction of the SiC semiconductor layer in the sectional view.

2. The semiconductor device according to claim 1, further comprising a source electrode electrically connected to the first conductivity type source region, wherein the source breakdown voltage holding region is connected below the source electrode.

3. The semiconductor device according to claim 1, wherein the source breakdown voltage holding region includes a body contact region that is electrically connected to the second conductivity type body region.

4. The semiconductor device according to claim 1, wherein the source breakdown voltage holding region is covered with the high-concentration region.

5. The semiconductor device according to claim 2, wherein the source electrode includes a convex portion embedded in the SiC semiconductor layer.

6. The semiconductor device according to claim 1, wherein a plurality of gate trenches in a lateral direction perpendicular to the thickness direction of the SiC semiconductor layer in the sectional view are formed, and the source breakdown voltage holding region is formed between the adjacent gate trenches.

7. The semiconductor device according to claim 1, wherein the first conductivity type source region forms a part of the side wall of the gate trench.

8. The semiconductor device according to claim 1, wherein the second conductivity type body region forms a part of the side wall of the gate trench.

9. The semiconductor device according to claim 6, wherein the source breakdown voltage holding region is away from the adjacent gate trenches in the lateral direction.

10. The semiconductor device according to claim 1, wherein the source breakdown voltage holding region is wider than the gate trench in a lateral direction perpendicular to the thickness direction of the SiC semiconductor layer in the sectional view.

11. The semiconductor device according to claim 1, wherein the source breakdown voltage holding region has a width in a lateral direction perpendicular to the thickness direction of the SiC semiconductor layer in the sectional view and a depth from the front surface of the SiC semiconductor layer in the thickness direction, the width of the source breakdown voltage holding region is larger than the depth of the source breakdown voltage holding region.

* * * * *